(12) United States Patent
Schardt et al.

(10) Patent No.: US 7,695,180 B2
(45) Date of Patent: Apr. 13, 2010

(54) ILLUMINATION ASSEMBLY AND SYSTEM

(75) Inventors: Craig R. Schardt, St. Paul, MN (US);
D. Scott Thompson, Woodbury, MN (US); Kenneth A. Epstein, St. Paul, MN (US); Brian W. Ostlie, Hudson, WI (US); Richard F. Griffith, Minneapolis, MN (US); Kenneth L. Smith, White Bear Lake, MN (US)

(73) Assignee: 3M Innovative Properties Company, St. Paul, MN (US)

( * ) Notice: Subject to any disclaimer, the term of this patent is extended or adjusted under 35 U.S.C. 154(b) by 308 days.

(21) Appl. No.: 11/467,230

(22) Filed: Aug. 25, 2006

(65) Prior Publication Data

US 2007/0047254 A1 Mar. 1, 2007

Related U.S. Application Data

(60) Provisional application No. 60/711,551, filed on Aug. 27, 2005, provisional application No. 60/711,519, filed on Aug. 27, 2005, provisional application No. 60/714,072, filed on Sep. 2, 2005, provisional application No. 60/714,068, filed on Sep. 2, 2005, provisional application No. 60/729,370, filed on Oct. 21, 2005.

(51) Int. Cl.
*F21V 7/04* (2006.01)
(52) U.S. Cl. .................. 362/625; 362/243; 362/607; 362/609; 362/623; 362/29; 362/30; 362/97.2; 362/330
(58) Field of Classification Search ................ 362/625, 362/607, 613, 609, 623, 29, 30, 97.2, 97.4, 362/223, 242, 243, 246, 330, 339
See application file for complete search history.

(56) References Cited

U.S. PATENT DOCUMENTS

| 3,532,871 A | 10/1970 | Shipman |
| 4,241,980 A | 12/1980 | Mihalakis et al. |
| 4,349,598 A | 9/1982 | White |
| 4,561,044 A | 12/1985 | Ogura et al. |

(Continued)

FOREIGN PATENT DOCUMENTS

CN 1512232 7/2004

(Continued)

OTHER PUBLICATIONS

U.S. Application entitled "Illumination Assembly and System", filed on Oct. 21, 2005, having U.S. Appl. No. 60/729,370.

(Continued)

*Primary Examiner*—Sandra L O'Shea
*Assistant Examiner*—Jessica L McMillan
(74) *Attorney, Agent, or Firm*—Jay R. Pralle

(57) ABSTRACT

Illumination assemblies and systems using same are disclosed. The illumination assembly can include a reflective substrate, and a light source unit including one or more light sources capable of producing illumination light. The assembly can further include a first light extraction surface including an azimuthal beam widening topography, where the first light extraction surface is positioned such that the light source unit is between the first light extraction surface and the reflective substrate. The first light extraction surface can face the light source unit.

26 Claims, 15 Drawing Sheets

U.S. PATENT DOCUMENTS

| | | | |
|---|---|---|---|
| 4,588,258 A | 5/1986 | Hoopman | |
| 4,775,219 A | 10/1988 | Appeldorn et al. | |
| 4,850,665 A | 7/1989 | Whitehead | |
| 4,906,070 A | 3/1990 | Cobb, Jr. | |
| 4,938,563 A | 7/1990 | Nelson et al. | |
| 4,952,023 A | 8/1990 | Bradshaw et al. | |
| 5,122,902 A | 6/1992 | Benson | |
| 5,136,479 A | 8/1992 | Ruffner | |
| 5,138,488 A | 8/1992 | Szczech | |
| 5,186,530 A | 2/1993 | Whitehead | |
| 5,195,818 A | 3/1993 | Simmons et al. | |
| 5,309,544 A | 5/1994 | Saxe | |
| 5,337,068 A | 8/1994 | Stewart et al. | |
| 5,339,382 A | 8/1994 | Whitehead | |
| 5,375,043 A | 12/1994 | Tokunaga | |
| 5,396,350 A | 3/1995 | Beeson et al. | |
| 5,450,285 A | 9/1995 | Schlemmer | |
| 5,485,038 A | 1/1996 | Licari et al. | |
| 5,598,281 A | 1/1997 | Zimmerman et al. | |
| 5,638,084 A | 6/1997 | Kalt | |
| 5,676,453 A | 10/1997 | Parkyn, Jr. et al. | |
| 5,751,388 A | 5/1998 | Larson | |
| 5,793,456 A | 8/1998 | Broer et al. | |
| 5,825,543 A | 10/1998 | Ouderkirk et al. | |
| 5,828,488 A | 10/1998 | Ouderkirk et al. | |
| 5,840,405 A | 11/1998 | Shusta et al. | |
| 5,845,038 A | 12/1998 | Lundin et al. | |
| 5,867,316 A | 2/1999 | Carlson et al. | |
| 5,882,774 A | 3/1999 | Jonza et al. | |
| 5,889,615 A | 3/1999 | Dreyer et al. | |
| 5,899,552 A | 5/1999 | Yokoyama et al. | |
| 5,948,488 A | 9/1999 | Marecki et al. | |
| 5,959,316 A | 9/1999 | Lowery | |
| 6,007,209 A | 12/1999 | Pelka | |
| 6,079,844 A | 6/2000 | Whitehead et al. | |
| 6,096,247 A | 8/2000 | Ulsh et al. | |
| 6,101,032 A | 8/2000 | Wortman et al. | |
| 6,111,696 A | 8/2000 | Allen et al. | |
| 6,122,103 A | 9/2000 | Perkins et al. | |
| 6,164,782 A | 12/2000 | Pojar | |
| 6,241,363 B1 | 6/2001 | Lee | |
| 6,277,471 B1 | 8/2001 | Tang | |
| 6,280,822 B1 | 8/2001 | Smith et al. | |
| 6,287,670 B1 | 9/2001 | Benson et al. | |
| 6,317,263 B1 | 11/2001 | Moshrefzadeh et al. | |
| 6,330,111 B1 | 12/2001 | Myers | |
| 6,331,915 B1 | 12/2001 | Myers | |
| 6,354,709 B1 | 3/2002 | Campbell et al. | |
| 6,367,941 B2 | 4/2002 | Lea et al. | |
| 6,416,201 B1 | 7/2002 | Strand et al. | |
| 6,447,136 B1 | 9/2002 | Liu et al. | |
| 6,473,554 B1 | 10/2002 | Pelka et al. | |
| 6,504,649 B1 | 1/2003 | Myers | |
| 6,505,959 B2 | 1/2003 | Masaki et al. | |
| 6,568,822 B2 | 5/2003 | Boyd et al. | |
| 6,582,103 B1 | 6/2003 | Popovich et al. | |
| 6,598,998 B2 | 7/2003 | West et al. | |
| 6,604,839 B2 | 8/2003 | Coleman et al. | |
| 6,612,723 B2 | 9/2003 | Futhey et al. | |
| 6,655,810 B2 | 12/2003 | Hayashi et al. | |
| 6,674,096 B2 | 1/2004 | Sommers | |
| 6,700,716 B2 | 3/2004 | Sejkora | |
| 6,709,122 B2 | 3/2004 | Adachi et al. | |
| 6,752,505 B2 | 6/2004 | Parker et al. | |
| 6,759,113 B1 | 7/2004 | Tang | |
| 6,762,743 B2 | 7/2004 | Yoshihara et al. | |
| 6,764,096 B2 | 7/2004 | Quioc | |
| 6,767,609 B2 | 7/2004 | Aeling et al. | |
| 6,771,335 B2 | 8/2004 | Kimura et al. | |
| 6,805,468 B2 | 10/2004 | Itoh et al. | |
| 6,827,456 B2 | 12/2004 | Parker et al. | |
| 6,843,582 B2 | 1/2005 | Chang | |
| 6,845,212 B2 | 1/2005 | Gardiner et al. | |
| 6,846,089 B2 | 1/2005 | Stevenson et al. | |
| 6,874,902 B2 | 4/2005 | Yamashita et al. | |
| 6,888,595 B2 | 5/2005 | Umemoto | |
| 6,964,497 B2 | 11/2005 | Greiner | |
| 6,974,229 B2 | 12/2005 | West et al. | |
| 7,278,771 B2 | 10/2007 | Campbell | |
| 2001/0021110 A1 | 9/2001 | Nakayama et al. | |
| 2002/0005991 A1 | 1/2002 | Masaki et al. | |
| 2002/0080598 A1 | 6/2002 | Parker et al. | |
| 2002/0097354 A1 | 7/2002 | Greiner | |
| 2002/0159019 A1 | 10/2002 | Pokorny et al. | |
| 2002/0163791 A1 | 11/2002 | Hoelen et al. | |
| 2002/0190406 A1 | 12/2002 | Merrill et al. | |
| 2003/0035231 A1 | 2/2003 | Epstein et al. | |
| 2003/0039030 A1 | 2/2003 | Myers | |
| 2003/0058553 A1 | 3/2003 | Epstein et al. | |
| 2003/0076034 A1 | 4/2003 | Marshall et al. | |
| 2003/0107892 A1 | 6/2003 | Yao | |
| 2003/0214728 A1 | 11/2003 | Olczak | |
| 2004/0001330 A1 | 1/2004 | Kang et al. | |
| 2004/0012943 A1 | 1/2004 | Toyooka | |
| 2004/0041965 A1 | 3/2004 | Liu | |
| 2004/0070100 A1 | 4/2004 | Strobel et al. | |
| 2004/0080938 A1 | 4/2004 | Holman et al. | |
| 2004/0093779 A1 | 5/2004 | Blach | |
| 2004/0114343 A1 | 6/2004 | Ho | |
| 2004/0174717 A1 | 9/2004 | Adachi et al. | |
| 2004/0183787 A1 | 9/2004 | Geaghan et al. | |
| 2004/0218388 A1 | 11/2004 | Suzuki | |
| 2004/0218390 A1 | 11/2004 | Holman et al. | |
| 2004/0228106 A1 | 11/2004 | Stevenson et al. | |
| 2004/0228107 A1 | 11/2004 | Lee et al. | |
| 2004/0233665 A1 | 11/2004 | West et al. | |
| 2004/0262623 A1 | 12/2004 | You | |
| 2005/0001537 A1 | 1/2005 | West et al. | |
| 2005/0002205 A1 | 1/2005 | Yu et al. | |
| 2005/0024754 A1 | 2/2005 | Epstein et al. | |
| 2005/0063063 A1 | 3/2005 | Ashdown | |
| 2005/0073070 A1 | 4/2005 | Getschel et al. | |
| 2005/0094401 A1 | 5/2005 | Magarill | |
| 2005/0111241 A1 | 5/2005 | Parker | |
| 2005/0122591 A1 | 6/2005 | Parker et al. | |
| 2005/0156495 A1 | 7/2005 | Tomoda et al. | |
| 2005/0243576 A1 | 11/2005 | Park et al. | |
| 2005/0265029 A1 | 12/2005 | Epstein et al. | |
| 2005/0280752 A1 | 12/2005 | Kim et al. | |
| 2006/0055627 A1 | 3/2006 | Wilson | |
| 2006/0072313 A1 | 4/2006 | Magarill | |
| 2006/0082698 A1 | 4/2006 | Ko et al. | |
| 2006/0082700 A1 | 4/2006 | Gehlsen et al. | |
| 2006/0092490 A1 | 5/2006 | McCollum et al. | |
| 2006/0131596 A1 | 6/2006 | Ouderkirk et al. | |
| 2006/0131601 A1 | 6/2006 | Ouderkirk et al. | |
| 2006/0131602 A1 | 6/2006 | Ouderkirk et al. | |
| 2006/0158080 A1 | 7/2006 | Nakano et al. | |
| 2006/0262554 A1 | 11/2006 | Mok et al. | |
| 2006/0290844 A1 | 12/2006 | Epstein et al. | |

FOREIGN PATENT DOCUMENTS

| | | |
|---|---|---|
| CN | 1654979 | 8/2005 |
| EP | 1 486 818 | 12/2004 |
| EP | 1 496 489 | 1/2005 |
| EP | 1 550 886 | 7/2005 |
| GB | 2 267 378 | 12/1993 |
| JP | 2002-244572 | 8/2002 |
| JP | 2003-036713 | 2/2003 |
| JP | 2004-055327 | 2/2004 |
| JP | 2004-109644 | 4/2004 |
| JP | 2004-221390 | 8/2004 |
| JP | 2004/325958 | 11/2004 |

| | | |
|---|---|---|
| JP | 2005/100837 | 4/2005 |
| JP | 2006/32103 | 2/2006 |
| KR | 10-2004-0061959 | 7/2004 |
| KR | 10-2004-0083891 | 10/2004 |
| KR | 10-2006-0000765 | 1/2006 |
| WO | WO 99/42861 | 8/1999 |
| WO | WO 02/04858 | 1/2002 |
| WO | WO 2005/003851 | 1/2005 |
| WO | WO 2005/031483 | 4/2005 |
| WO | WO 2005/073622 | 8/2005 |
| WO | WO 2005/120791 | 12/2005 |

OTHER PUBLICATIONS

U.S. Application entitled "Direct Lit Backlight with Light Recycling and Source Polarizers", filed on Feb. 24, 2005, having U.S. Apppl. No. 11/064,685.

U.S. Application entitled "Method of Forming Direct-lit Backlights having Light Recycling Cavity with Concave Transflector", filed on Aug. 27, 2005, having U.S. Appl. No. 60/711,523.

U.S. Application entitled "Methods of Forming Direct-lit Backlights having Light Recycling Cavity with Concave Transflector," filed on Aug. 23, 2006, having U.S. Appl. No. 11/466,787.

U.S. Application entitled "Edge-lit Backlight having Light Recycling Cavity with Concave Transflector," filed on Aug. 27, 2005, having U.S. Appl. No. 60/711,250.

U.S. Application entitled "Edge-lit Backlight having Light Recycling Cavity with Concave Transflector," filed on Aug. 23, 2006, having U.S. Appl. No. 11/466,628.

U.S. Application entitled "Direct-lit Backlight having Light Sources with Bifunctional Diverters", filed on Aug. 27, 2005, having U.S. Appl. No. 60/711,522.

U.S. Application entitled "Direct-lit Backlight having Light Sources with Bifunctional Diverters," filed on Jul. 20, 2006, having U.S. Appl. No. 11/458,891.

U.S. Application entitled "Illumination Assembly and System Using Same", filed on Aug. 27, 2005, having U.S. Appl. No. 60/711,519.

U.S. Application entitled "Color Mixing Illumination Assembly and System using Same", filed on Aug. 27, 2005, having U.S. Appl. No. 60/711,551.

U.S. Application entitled "Illumination Assembly and System using Same", filed on Sep. 2, 2005, having U.S. Appl. No. 60/714,068.

U.S. Application entitled "Color Mixing Illumination Assembly and System using Same", filed on Sep. 2, 2005, having U.S. Appl. No. 60/714,072.

U.S. Application entitled "Direct-lit Backlight Having Light Recycling Cavity with Concave Transflector," filed on Aug. 27, 2005, having U.S. Appl. No. 11/212,166.

Brochure "3M™ Image Directing Film (IDF) II," ©3M, 1996.

Brochure "3M™ Diffusing Film Alternative (DFA)," ©3M, St. Paul, MN (1996).

Brochure "3M™ Transmissive Right Angle Film (TRAF) II," ©3M, St. Paul, MN (1996).

Brochure "3M™ Brightness Enhancement Film (BEF) I," ©3M, St. Paul, MN (1996).

Brochure "Callism® Prism," EFUN Technology Co., Ltd., Tainan, Taiwan (no date).

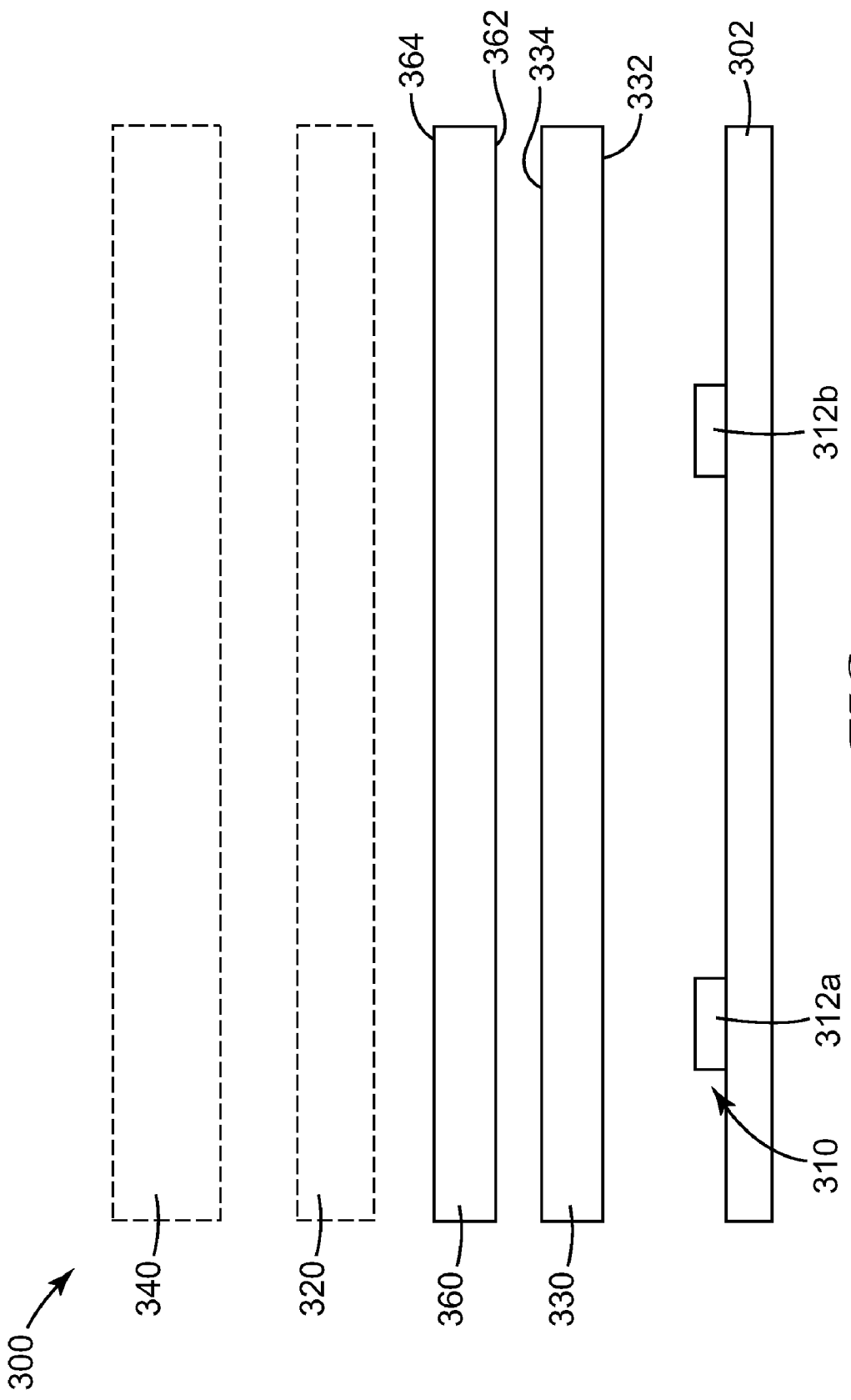

ILLUMINATION ASSEMBLY AND SYSTEM

RELATED APPLICATIONS

This application claims the benefit of the following U.S. Provisional Patent Applications, the disclosures of which are incorporated by reference in their entireties: 60/711,519, filed Aug. 27, 2005; 60/711,551, filed Aug. 27, 2005; 60/714,072, filed Sep. 2, 2005; 60/714,068, filed Sep. 2, 2005; and 60/729,370, filed Oct. 21, 2005.

The following co-owned and copending U.S. patent applications are incorporated herein by reference: U.S. patent application Ser. No. 11/212,166, titled DIRECT-LIT BACKLIGHT HAVING LIGHT RECYCLING CAVITY WITH CONCAVE TRANSFLECTOR; U.S. patent application Ser. No. 11/458,891, titled DIRECT-LIT BACKLIGHT HAVING LIGHT SOURCES WITH BIFUNCTIONAL DIVERTERS; U.S. patent application Ser. No. 11/466,628, titled EDGE-LIT BACKLIGHT HAVING LIGHT RECYCLING CAVITY WITH CONCAVE TRANSFLECTOR; and U.S. patent application Ser. No. 11/466,787, titled METHODS OF FORMING DIRECT-LIT BACKLIGHTS HAVING LIGHT RECYCLING CAVITY WITH CONCAVE TRANSFLECTOR.

BACKGROUND

Some display systems, for example, liquid crystal displays (LCDs), are illuminated from behind. Such displays find widespread application in many devices, e.g., laptop computers, hand-held calculators, digital watches, televisions, and the like. Some back-lit displays include a light source that is located to the side of the display, with a light guide positioned to guide the light from the light source to the back of the display panel. Other backlit displays, e.g., some LCD monitors and LCD televisions (LCD-TVs), are directly illuminated from behind using a number of light sources positioned behind the display panel. This direct lit backlight arrangement is increasingly common with larger displays because the light power requirements needed to achieve a certain level of display brightness increase with the square of the display size, whereas the available real estate for locating light sources along the side of the display only increases linearly with display size. In addition, some display applications, such as LCD-TVs, require that the display be bright enough to be viewed from a greater distance than is required for other display applications. Further, viewing angle requirements for LCD-TVs are generally different from those for LCD monitors and hand-held devices.

LCD monitors and LCD-TVs are commonly illuminated from behind by a number of cold cathode fluorescent lamps (CCFLs). These light sources are linear and stretch across the full width of the display, with the result that the back of the display is illuminated by a series of bright stripes separated by darker regions. Such an illumination profile is not desirable; therefore, a diffuser plate is typically used at the back of the LCD device to smooth the illumination profile.

Currently, LCD-TV diffuser plates commonly employ a polymeric matrix of polymethyl methacrylate (PMMA) with a variety of dispersed phases that include glass, polystyrene beads, and $CaCO_3$ particles. These plates often deform or warp after exposure to the elevated temperatures caused by the lamps. In addition, these diffuser plates require customized extrusion compounding to distribute the diffusing particles uniformly throughout the polymer matrix, which further increases costs. Some diffuser plates are provided with a diffusion characteristic that varies spatially across its width in an attempt to make the illumination profile at the back of the LCD panel more uniform. Such non-uniform diffusers are sometimes referred to as printed pattern diffusers. These non-uniform diffusers are expensive to manufacture because the diffusing pattern must be registered to the illumination source at the time of assembly.

Recently, liquid crystal display television sets (LCD TVs) have been introduced that use a direct-lit backlight powered not by CCFLs but by an array, e.g., of red/green/blue LEDs. An example is the Sony™ Qualia 005 LED Flat-Screen TV. The 40 inch model uses a direct-lit backlight containing five horizontal rows of side-emitting Luxeon™ LEDs, each row containing 65 such LEDs arranged in a GRBRG repeating pattern, and the rows being spaced 3.25 inches apart. This backlight is about 42 mm deep, measured from the front of a diffuse white back reflector to the back of a (about 2 mm thick) front diffuser, between which is positioned a flat transparent plate having an array of 325 diffuse white reflective spots. Each of these spots, which transmit some light, is aligned with one of the LEDs to prevent most of the on-axis light emitted by the LED from striking the front diffuser. The back reflector is flat with angled sidewalls.

An important aspect of some backlights is that the light illuminating the display panel should be uniformly bright. Illuminance uniformity is particularly a problem when the light sources used are point sources, e.g., LEDs. In such cases, the backlight is required to spread the light across the display panel so that the displayed image lacks dark areas. In addition, in some applications, the display panel is illuminated with light from a number of different LEDs that produce light of different colors. Because the human eye more easily discerns variations in color than in brightness, it can be difficult to effectively mix light sources that produce different colors to produce white illumination light. It is important in these situations that the light from the different LEDs be mixed so that the color, as well as the brightness, are uniform across the displayed image.

SUMMARY

In one aspect, the present disclosure provides an illumination assembly that includes a reflective substrate, a first light extraction surface including an azimuthal beam widening topography, and a light source unit. The light source unit includes one or more light sources capable of producing illumination light, where the light source unit is between the first light extraction surface and the reflective substrate. The first light extraction surface faces the light source unit.

In another aspect, the present disclosure provides an illumination assembly that includes a reflective substrate, and a first light extraction surface including an array of closely packed conical structures. The array includes substantially no flat land areas between the conical structures where a base of the conical structures lies in an x-y plane of the surface and an apex of the conical structures lies outside the x-y plane of the surface. The assembly also includes a light source unit including one or more light sources capable of producing illumination light, where the light source unit is between the first light extraction surface and the reflective substrate. The apexes of the conical structures in the array on the first light extraction surface are directed toward the light source unit.

In another aspect, the present disclosure provides an illumination assembly that includes a reflective substrate, and a first light extraction surface including at least one faceted surface, where the faceted surface has an in-plane curvature in the x-y plane. The assembly also includes a light source unit including one or more light sources capable of producing illumination light, where the light source unit is between the first light extraction surface and the reflective substrate. The first light extraction surface faces the light source unit.

In another aspect, the present disclosure provides an illumination assembly that includes a reflective substrate, and a first light extraction surface including means for producing a difference of azimuthal angle $\Delta\beta$ of at least 15° with respect to a beam normally incident on the light extraction surface. The assembly also includes a light source unit including one or more light sources capable of producing illumination light, where the light source unit is between the first light extraction surface and the reflective substrate. The first light extraction surface faces the light source unit.

In another aspect, the present disclosure provides a directly illuminated display system that includes a display panel including an illumination side, and an illumination assembly disposed to the illumination side of the display panel. The illumination assembly includes a reflective substrate, and a light source unit including one or more light sources capable of producing illumination light. The assembly also includes a first light extraction surface between the first light extraction surface and the reflective substrate, where the first light extraction surface faces the light source unit, and where the first light extraction surface has an azimuthal beam widening topography.

These and other aspects of the present application will be apparent from the detailed description below. In no event, however, should the above summaries be construed as limitations on the claimed subject matter, which subject matter is defined solely by the attached claims, as may be amended during prosecution.

BRIEF DESCRIPTION OF THE DRAWINGS

FIG. 3 is a schematic cross-sectional view of one embodiment of an illumination assembly that includes two light extraction elements.

FIG. 7d is a schematic view.

In the figures, like reference numerals designate like elements.

DETAILED DESCRIPTION

The present disclosure is applicable to display panels, such as liquid crystal displays (LCDs, or LC displays), and is particularly applicable to LCDs that are directly illuminated from behind, for example, as are used in LCD monitors and LCD televisions (LCD-TVs). More specifically, the disclosure is directed to the management of light generated by a direct-lit backlight for illuminating a LC display.

In conventional illumination assemblies, the bulb-to-diffuser spacing, the bulb-to-bulb spacing, and the diffuser transmission are significant factors to be considered in designing the assembly for a given value of brightness and uniformity of illumination. Generally, a strong diffuser, i.e., a diffuser that diffuses a higher fraction of the incident light, improves the uniformity but results in reduced brightness because the high diffusing level is accompanied by strong back diffusion, i.e., reflection.

According to some embodiments of the present disclosure, a light extraction element, which is positioned proximate the light sources, may provide greater illuminance uniformity and/or color mixing while enabling use of a higher transmission diffuser. Generally, high transmission diffusers, which are typically thinner than stronger diffusers, can help reduce the thickness profile of the backlight. A light extraction element has a light extraction surface that extracts and diverts at least some of the illumination light from the light sources that initially propagates in a direction parallel to an axis of the display into a direction that is non-parallel to the axis.

In embodiments where the light source unit includes light sources capable of producing light having different peak wavelengths or colors (e.g., an array of red, green, and blue LEDs), the light extraction element is operable to distribute the light such that it is more uniform in color and intensity upon reaching the LC panel. For example, when white illumination light is desired, the light extraction element can mix light from individually colored light sources such that the appearance at the LC panel is of a more uniform white light. The light extraction element accomplishes this in a significantly thinner cavity than would be required for a direct-lit LED backlight that utilizes standard diffusers.

The illumination assemblies of the present disclosure can be utilized as backlights for direct-lit display systems, e.g., LC displays. However, the illumination assemblies as described herein are not restricted to use for illuminating a liquid crystal display panel. The disclosed illumination assemblies may also be used wherever discrete light sources are utilized to generate light, and it is desirable to have uniform illumination out of a panel that includes one of more of the discrete light sources. Thus, the described illumination assemblies may be useful in solid state space lighting applications, and in signs, illuminated panels, and the like.

Figure 1:
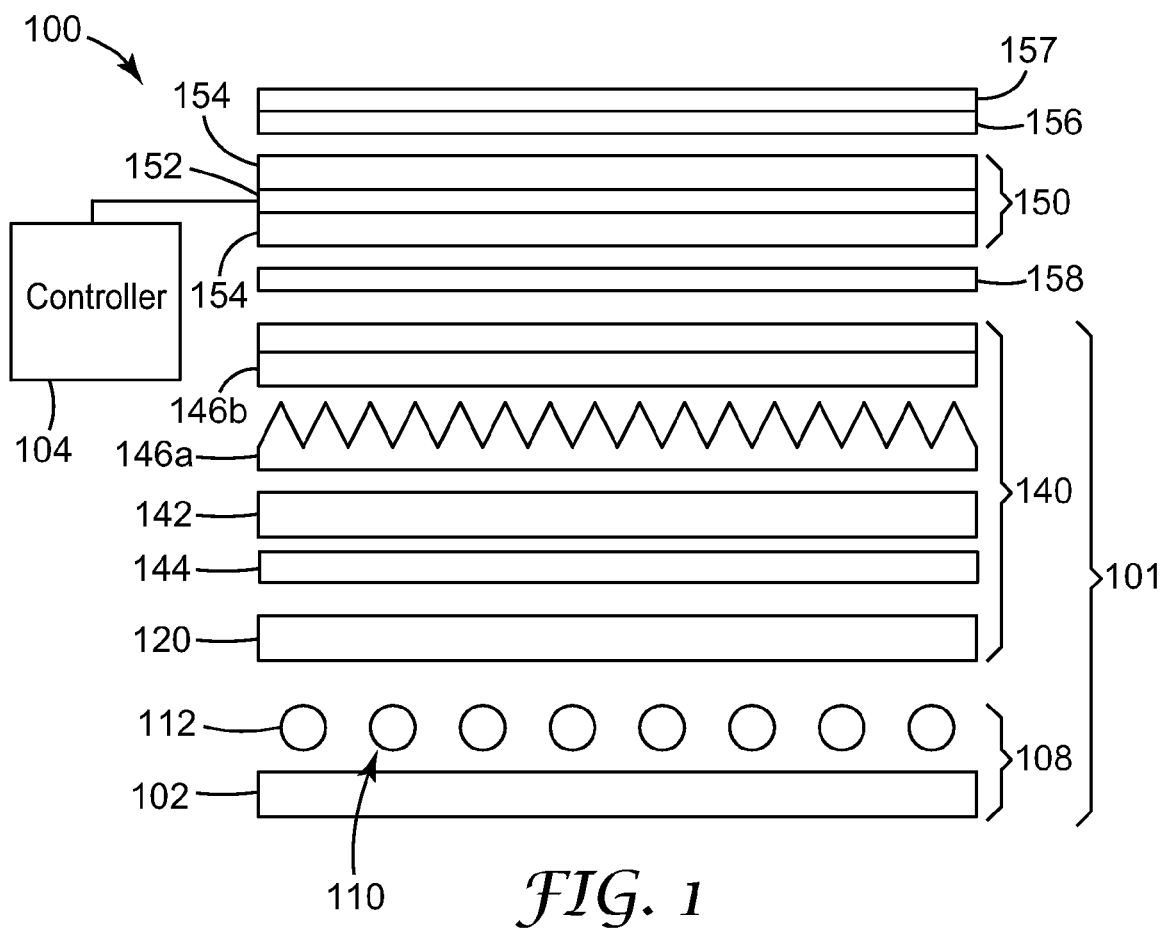
FIG. 1 is a schematic cross-sectional view of one embodiment of a back-lit liquid crystal display system.

A schematic cross-sectional view of one embodiment of a direct-lit display system 100 is presented in FIG. 1. Such a display system 100 may be used, for example, in an LCD monitor or LCD-TV. The display system 100 includes an LC panel 150 and an illumination assembly 101 positioned to provide illumination light to the LC panel 150. The LC panel 150 typically includes a layer of LC 152 disposed between panel plates 154. The plates 154 are often formed of glass and may include electrode structures and alignment layers on their inner surfaces for controlling the orientation of the liquid crystals in the LC layer 152. These electrode structures are commonly arranged so as to define LC panel pixels, i.e., areas of the LC layer where the orientation of the liquid crystals can be controlled independently of adjacent areas. A color filter may also be included with one or more of the plates 152 for imposing color on the image displayed by the LC panel 150.

The LC panel 150 is positioned between an upper absorbing polarizer 156 and a lower absorbing polarizer 158. In the illustrated embodiment, the upper and lower absorbing polarizers 156, 158 are located outside the LC panel 150. The absorbing polarizers 156, 158 and the LC panel 150 in combination control the transmission of light from a backlight 108 through the display system 100 to the viewer. For example, the absorbing polarizers 156, 158 may be arranged with their transmission axes perpendicular to each other. In an unactivated state, a pixel of the LC layer 152 may not change the polarization of light passing therethrough. Accordingly, light that passes through the lower absorbing polarizer 158 is absorbed by the upper absorbing polarizer 156. When the pixel is activated, the polarization of the light passing therethrough is rotated so that at least some of the light that is transmitted through the lower absorbing polarizer 158 is also transmitted through the upper absorbing polarizer 156. Selective activation of the different pixels of the LC layer 152, for example, by a controller 104, results in the light passing out of the display system 100 at certain desired locations, thus forming an image seen by the viewer. The controller 104 may include, for example, a computer or a television controller that receives and displays television images.

One or more optional layers 157 may be provided over the upper absorbing polarizer 156, for example, to provide mechanical and/or environmental protection to the display surface. In one exemplary embodiment, the layer 157 may include a hardcoat over the upper absorbing polarizer 156.

It will be appreciated that some types of LC displays may operate in a manner different from that described above. For example, the absorbing polarizers may be aligned parallel and the LC panel may rotate the polarization of the light when in an unactivated state. Regardless, the basic structure of such displays remains similar to that described above.

The illumination assembly 101 includes a backlight 108 and one or more light management films 140 positioned between the backlight 108 and the LC panel 150. The backlight 108 of the display system 100 includes a light source unit 110 having a number of light sources 112 that generate the light that illuminates the LC panel 150. The light source unit 110 is positioned proximate a reflective substrate 102. The light sources 112 used in an LCD-TV or LCD monitor are often linear, cold cathode, fluorescent tubes that extend along the height of the display system 100. Other types of light sources may be used, however, such as filament or arc lamps, LEDs, flat fluorescent panels, or external electrode fluorescent lamps. This list of light sources is not intended to be limiting or exhaustive, but only exemplary.

The light sources 112 are shown schematically. In most cases, these sources 112 are compact light emitting diodes (LEDs). In this regard, "LED" refers to a diode that emits light, whether visible, ultraviolet, or infrared. It includes incoherent encased or encapsulated semiconductor devices marketed as "LEDs", whether of the conventional or super radiant variety. If the LED emits non-visible light such as ultraviolet light, and in some cases where it emits visible light, it is packaged to include a phosphor (or it may illuminate a remotely disposed phosphor) to convert short wavelength light to longer wavelength visible light, in some cases yielding a device that emits white light. An "LED die" is an LED in its most basic form, i.e., in the form of an individual component or chip made by semiconductor processing procedures. The component or chip can include electrical contacts suitable for application of power to energize the device. The individual layers and other functional elements of the component or chip are typically formed on the wafer scale, and the finished wafer can then be diced into individual piece parts to yield a multiplicity of LED dies. More discussion of packaged LEDs, including forward-emitting and side-emitting LEDs, is provided herein.

If desired, other visible light emitters such as linear cold cathode fluorescent lamps (CCFLs) or hot cathode fluorescent lamps (HCFLs) can be used instead of or in addition to discrete LED sources as illumination sources for the disclosed backlights. In addition, hybrid systems such as, for example, (CCFL/LED), including cool white and warm white, CCFL/HCFL, such as those that emit different spectra, may be used. The combinations of light emitters may vary widely, and include LEDs and CCFLs, and pluralities such as, for example, multiple CCFLs, multiple CCFLs of different colors, and LEDs and CCFLs.

For example, in some applications it may be desirable to replace the row of discrete light sources 112 seen in FIG. 1 with a different light source such as a long cylindrical CCFL, or with a linear surface emitting light guide emitting light along its length and coupled to a remote active component (such as an LED die or halogen bulb), and to do likewise with other rows of sources. Examples of such linear surface emitting light guides are disclosed in U.S. Pat. Nos. 5,845,038 (Lundin et al.) and U.S. Pat. No. 6,367,941 (Lea et al.). Fiber-coupled laser diode and other semiconductor emitters are also known, and in those cases the output end of the fiber optic waveguide can be considered to be a light source with respect to its placement in the disclosed recycling cavities or otherwise behind the output area of the backlight. The same is also true of other passive optical components having small emitting areas such as lenses, deflectors, narrow light guides, and the like that give off light received from an active component such as a bulb or LED die. One example of such a passive component is a molded encapsulant or lens of a side-emitting packaged LED.

In some embodiments, the backlight 108 continuously emits white light, and the LC panel 150 is combined with a color filter matrix to form groups of multicolored pixels (such as yellow/blue (YB) pixels, red/green/blue (RGB) pixels, red/green/blue/white (RGBW) pixels, red/yellow/green/blue (RYGB) pixels, red/yellow/green/cyan/blue (RYGCB) pixels, or the like) so that the displayed image is polychromatic. Alternatively, polychromatic images can be displayed using color sequential techniques, where, instead of continuously back-illuminating the LC panel 150 with white light and modulating groups of multicolored pixels in the LC panel 150 to produce color, separate differently colored light sources within the backlight 108 itself (selected, for example, from red, orange, amber, yellow, green, cyan, blue (including royal blue), and white in combinations such as those mentioned above) are modulated such that the backlight flashes a spatially uniform colored light output (such as, for example, red, then green, then blue) in rapid repeating succession. This color-modulated backlight is then combined with a display module that has only one pixel array (without any color filter matrix), the pixel array being modulated synchronously with the backlight to produce the whole gamut of achievable colors (given the light sources used in the backlight) over the entire pixel array, provided the modulation is fast enough to yield temporal color-mixing in the visual system of the observer. Examples of color sequential displays, also known as field sequential displays, are described in U.S. Pat. No. 5,337,068 (Stewart et al.) and U.S. Pat. No. 6,762,743 (Yoshihara et al.). In some cases, it may be desirable to provide only a monochrome display. In those cases the backlight 108 can include filters or specific sources that emit predominantly in one visible wavelength or color.

The backlight 108 may also include a reflective substrate 102 for reflecting light from the light sources 112 propagating in a direction away from the LC panel 150. The reflective substrate 102 may also be useful for recycling light within the display system 100, as is further explained herein.

The reflective substrate 102 is preferably highly reflective for enhanced panel efficiency. For example, the reflective substrate 102 may have an average reflectivity for visible light emitted by the light sources of at least 90%, 95%, 98%, 99%, or more. The reflective substrate 102 can be a predominantly specular, diffuse, or combination specular/diffuse reflector, whether spatially uniform or patterned. In some cases, the reflective substrate 102 can be made from a stiff metal substrate with a high reflectivity coating, or a high reflectivity film laminated to a supporting substrate. Suitable high reflectivity materials include Vikuiti™ Enhanced Specular Reflector (ESR) multilayer polymeric film available from 3M Company; a film made by laminating a barium sulfate-loaded polyethylene terephthalate film (2 mils thick) to Vikuiti™ ESR film using a 0.4 mil thick isooctylacrylate acrylic acid pressure sensitive adhesive, the resulting laminate film referred to herein as "EDR II" film; E-60 series Lumirror™ polyester film available from Toray Industries, Inc.; porous polytetrafluoroethylene (PTFE) films, such as those available from W. L. Gore & Associates, Inc.; Spectralon™ reflectance material available from Labsphere, Inc.; Miro™ anodized aluminum films (including Miro™ 2 film) available from Alanod Aluminum-Veredlung GmbH & Co.; MCPET high reflectivity foamed sheeting from Furukawa Electric Co., Ltd.; and White Refstar™ films and MT films available from Mitsui Chemicals, Inc.

The reflective substrate 102 may be substantially flat and smooth, or it may have a structured surface associated with it to enhance light scattering or mixing. Such a structured surface can be imparted (a) on the reflective surface of the reflective substrate 102, or (b) on a transparent coating applied to the reflective surface. In the former case, a highly reflecting film may be laminated to a substrate in which a structured surface was previously formed, or a highly reflecting film may be laminated to a flat substrate (such as a thin metal sheet, as with Vikuiti™ Durable Enhanced Specular Reflector-Metal (DESR-M) reflector available from 3M Company) followed by forming the structured surface, such as with a stamping operation. In the latter case, a transparent film having a structured surface can be laminated to a flat reflective surface, or a transparent film can be applied to the reflector and then afterwards a structured surface imparted to the top of the transparent film.

The reflective substrate 102 can be a continuous unitary (and unbroken) layer on which the light source(s) 112 are mounted, or it can be constructed discontinuously in separate pieces, or discontinuously insofar as it includes isolated apertures, through which light sources 112 can protrude, in an otherwise continuous layer. For example, strips of reflective material can be applied to a substrate on which rows of LEDs are mounted, each strip having a width sufficient to extend from one row of LEDs to another and having a length dimension sufficient to span between opposed borders of the backlight's output area.

The backlight 108 can also include sides and ends (not shown) located along the outer boundary of the backlight 108 that are preferably lined or otherwise provided with high reflectivity vertical walls to reduce light loss and improve recycling efficiency. The same reflective material used for the reflective substrate 102 can be used to form these walls, or a different reflective material can be used. In exemplary embodiments, the side walls are diffusely reflective.

An arrangement 140 of light management films, which may also be referred to as a light management unit, is positioned between the backlight 108 and the LC panel 150. The light management films 140 affect the illumination light propagating from the backlight 108 so as to improve the operation of the display system 100. For example, the arrangement 140 of light management films may include a diffuser 120. The diffuser 120 is used to diffuse the light received from the light sources 112, which results in increased uniformity of the illumination light incident on the LC panel 150. Consequently, this results in an image perceived by the viewer to be more uniformly bright.

The diffuser layer 120 may be any suitable diffuser film or plate. For example, the diffuser layer 120 can include any suitable diffusing material or materials. In some embodiments, the diffuser layer 120 may include a polymeric matrix of polymethyl methacrylate (PMMA) with a variety of dispersed phases that include glass, polystyrene beads, and $CaCO_3$ particles. Exemplary diffusers can include 3M™ Scotchcal™ Diffuser Film, types 3635-30 and 3635-70, available from 3M Company, St. Paul, Minn.

The light management unit 140 may also include a reflective polarizer 142. The light sources 112 typically produce unpolarized light, but the lower absorbing polarizer 158 only transmits a single polarization state; therefore, about half of the light generated by the light sources 112 is not transmitted through to the LC layer 152. The reflective polarizer 142, however, may be used to reflect the light that would otherwise be absorbed in the lower absorbing polarizer 158. Consequently, this light may be recycled by reflection between the reflective polarizer 142 and the reflective substrate 102. At least some of the light reflected by the reflective polarizer 142 may be depolarized and subsequently returned to the reflective polarizer 142 in a polarization state that is transmitted through the reflective polarizer 142 and the lower absorbing polarizer 158 to the LC layer 152. In this manner, the reflective polarizer 142 may be used to increase the fraction of light emitted by the light sources 112 that reaches the LC layer 152, thereby providing a brighter display output.

Any suitable type of reflective polarizer may be used for the reflective polarizer 142, e.g., multilayer optical film (MOF) reflective polarizers, diffusely reflective polarizing film (DRPF), such as continuous/disperse phase polarizers, wire grid reflective polarizers, or cholesteric reflective polarizers.

Both the MOF and continuous/disperse phase reflective polarizers rely on the difference in refractive index between at least two materials, usually polymeric materials, to selectively reflect light of one polarization state while transmitting light in an orthogonal polarization state. Some examples of MOF reflective polarizers are described in co-owned U.S. Pat. No. 5,882,774 (Jonza et al.). Commercially available examples of MOF reflective polarizers include Vikuiti™ DBEF-D200 and DBEF-D440 multilayer reflective polarizers that include diffusive surfaces, available from 3M Company.

Examples of DRPF useful in connection with the present disclosure include continuous/disperse phase reflective polarizers as described, e.g., in co-owned U.S. Pat. No. 5,825,543 (Ouderkirk et al.), and diffusely reflecting multilayer polarizers as described, e.g., in co-owned U.S. Pat. No. 5,867,316 (Carlson et al.). Other suitable types of DRPF are described in U.S. Pat. No. 5,751,388 (Larson).

Some examples of wire grid polarizers useful in connection with the present disclosure include those described, e.g., in U.S. Pat. No. 6,122,103 (Perkins et al.). Wire grid polarizers are commercially available from, inter alia, Moxtek Inc., Orem, Utah.

Some examples of cholesteric polarizers useful in connection with the present disclosure include those described, e.g., in U.S. Pat. No. 5,793,456 (Broer et al.), and U.S. Patent Publication No. 2002/0159019 (Pokomy et al.). Cholesteric polarizers are often provided along with a quarter wave retarding layer on the output side so that the light transmitted through the cholesteric polarizer is converted to linearly polarized light.

In some embodiments, a polarization control layer 144 may be provided between the diffuser plate 120 and the reflective polarizer 142. Examples of polarization control layers 144 include a quarter wave retarding layer and a polarization rotating layer such as a liquid crystal polarization rotating layer. The polarization control layer 144 may be used to change the polarization of light that is reflected from the reflective polarizer 142 so that an increased fraction of the recycled light is transmitted through the reflective polarizer 142.

The arrangement 140 of light management films may also include one or more brightness enhancing layers. A brightness enhancing layer is one that includes a surface structure that redirects off-axis light in a direction closer to the axis of the display. This increases the amount of light propagating on-axis through the LC layer 152, thus increasing the brightness of the image seen by the viewer. One example of a brightness enhancing layer is a prismatic brightness enhancing layer, which has a number of prismatic ridges that redirect the illumination light through refraction and reflection. Examples of prismatic brightness enhancing layers that may be used in the display system 100 include the Vikuiti™ BEF II and BEF III family of prismatic films available from 3M Company, including BEF II 90/24, BEF II 90/50, BEF IIIM 90/50, and BEF IIIT.

The exemplary embodiment illustrated in FIG. 1 shows a first brightness enhancing layer 146a disposed between the reflective polarizer 142 and the LC panel 150. A prismatic brightness enhancing layer typically provides optical gain in one dimension. An optional second brightness enhancing layer 146b may also be included in the arrangement 140 of light management layers, having its prismatic structure oriented orthogonally to the prismatic structure of the first brightness enhancing layer 146a. Such a configuration provides an increase in the optical gain of the display system 100 in two dimensions. In other exemplary embodiments, the brightness enhancing layers 146a, 146b may be positioned between the backlight 108 and the reflective polarizer 142.

The different layers in the light management unit 140 may be free standing. In other embodiments, two or more of the layers in the light management unit 140 may be laminated together, for example as discussed in co-owned U.S. patent application Ser. No. 10/966,610 (Ko et al.). In other exemplary embodiments, the light management unit 140 may include two subassemblies separated by a gap, for example, as described in co-owned U.S. patent application Ser. No. 10/965,937 (Gehlsen et al.).

The display system 100 of the embodiment illustrated in FIG. 1 can include any suitable illumination assembly described herein. In some embodiments, the backlight 108 can include one or more light extraction elements that can help to provide more uniform illumination light to the LC panel 150.

Figure 2:
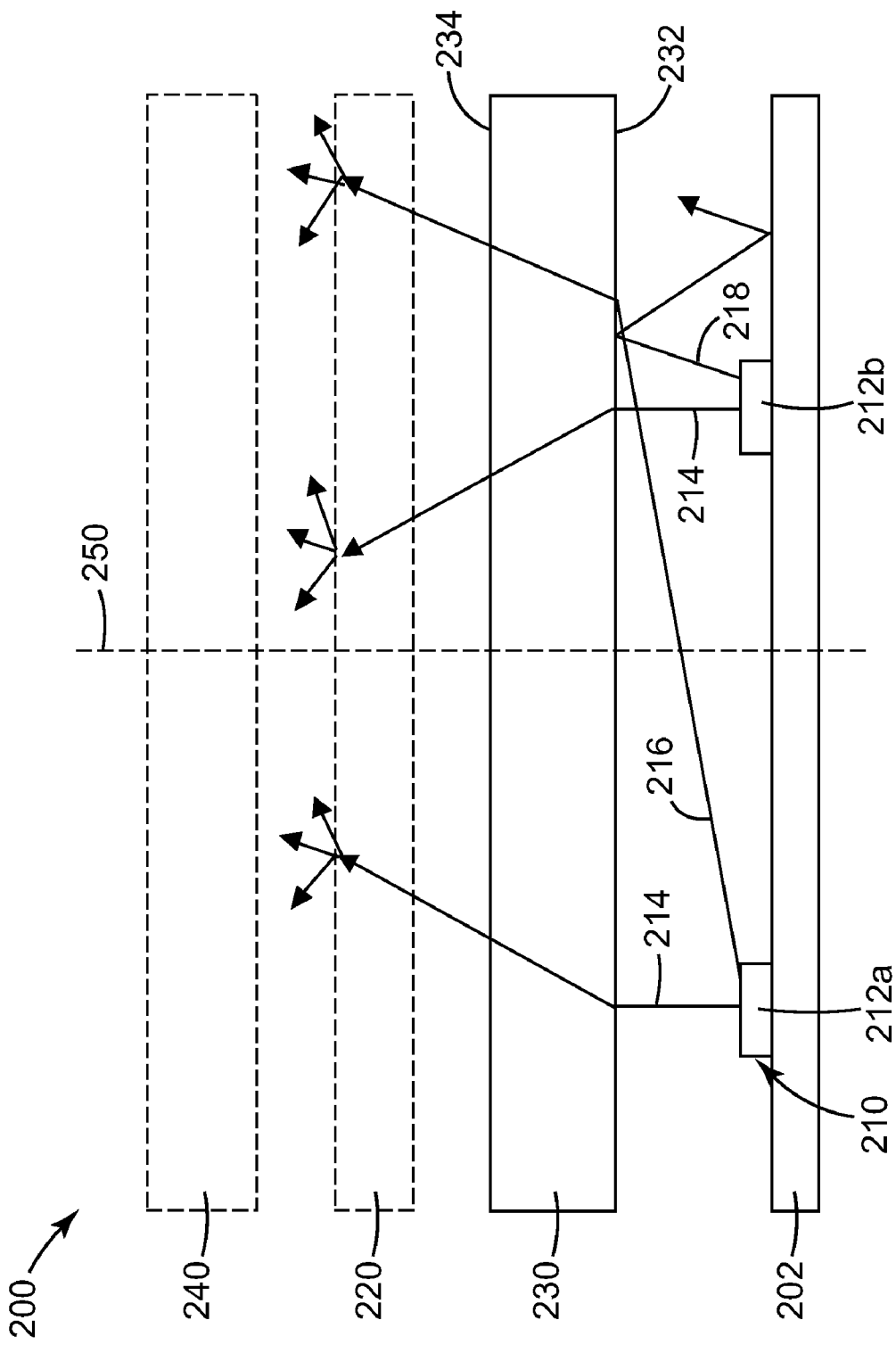
FIG. 2 is a schematic cross-sectional view of one embodiment of an illumination assembly that includes a light extraction element.

FIG. 2 is a schematic cross-sectional view of one embodiment of an illumination assembly 200 that includes at least one light extraction element. As illustrated, the illumination assembly 200 includes a reflective substrate 202 and a light source unit 210 positioned proximate the reflective substrate 202. The assembly 200 can also include an optional diffuser layer 220 positioned such that a first light extraction element 230 is between the diffuser layer 220 and the light source unit 210. All of the design considerations and possibilities for the reflective substrate 102, the light source unit 110, and the diffuser layer 120 of the embodiment illustrated in FIG. 1 apply equally to the reflective substrate 202, the light source unit 210, and the optional diffuser layer 220 of the embodiment illustrated in FIG. 2. The illumination assembly 200 also includes first light extraction element 230 positioned such that the light source unit 210 is between the first light extraction element 230 and the reflective substrate 202. However, other arrangements are also possible, such as where the reflective substrate 202 is configured with apertures or slots, and the light source unit 210 is mounted behind the reflective substrate 202 and aligned such that light from the individual light sources passes through the apertures or slots. Furthermore, in some cases it may be acceptable to simply omit the reflective substrate 202.

The light source unit 210 includes at least a first light source 212a and a second light source 212b (herein collectively referred to as light sources 212). Although two light sources are depicted, the light source unit 210 can include any suitable number of light sources.

In some embodiments, the light source unit 210 may be positioned on the reflective substrate 202; alternatively, the light source unit 210 may be spaced apart from the reflective substrate 202. In other embodiments, the light source unit 210 may include light sources that are positioned on or attached to the reflective substrate 202, e.g., as described in co-owned and copending U.S. patent application Ser. Nos. 11/018,608; 11/018,605; 11/018,961; and 10/858,539.

Figure 6:
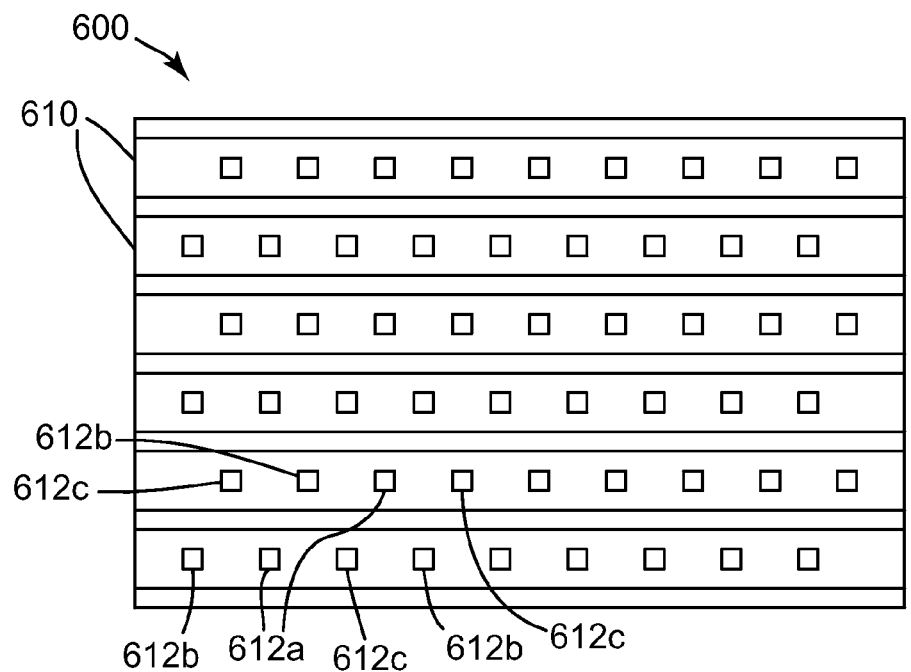
FIG. 6 is a schematic plan view of one embodiment of a light source unit.

Any suitable type of light source 212 may be used in the embodiment illustrated in FIG. 2, e.g., light sources 112 of FIG. 1. The light sources 212 may be positioned in any suitable arrangement on the reflective substrate 202. For example, the light sources 212 can be arranged in non-linear arrays such as hexagonal patterns or other geometric patterns, or in non-uniform (e.g. random or semi-random) arrays. FIG. 6 is a schematic plan view of one embodiment of a backlight 600 that includes a number of light source units 610. In the illustrated embodiment, the light source units 610 are configured as bars and each includes a number of light sources 612a, 612b, 612c, which may be located at staggered positions. The light source units 610 may have different shapes. In addition, the light sources 612a-c may produce light of different colors or wavelengths. For example, some light sources 612a may produce red light, while other light sources 612b produce green light, and other light sources 612c produce blue light. The differently colored light sources 612a-c may be arranged so as to increase the degree to which the light of different colors is mixed, thereby producing mixed light of a desired color uniformity. In other embodiments, the light sources 612a-c may each produce white light. Further, in some embodiments, the light sources 612a-c may be electrically connected to a controller such that the light sources 612a-c are independently controllable.

Returning to FIG. 2, the light source unit 210 can include light sources 212 that emit different wavelengths or colors of illumination light. For example, the light source unit 210 may include a first light source 212a that emits a first wavelength of illumination light, and a second light source 212b that emits a second wavelength of illumination light. The first wavelength may be the same as or different from the second wavelength. The light source unit 210 may also include a third light source (not shown) that emits a third wavelength of light. In some embodiments, the various light sources 212 of the light source unit 210 may produce light that, when mixed, provides white illumination light to a display panel or other device. In other embodiments, the light sources 212 may each produce white light.

First light extraction element 230 is positioned such that the light source unit 210 is between the first light extraction element 230 and the reflective substrate 202. The first light extraction element 230 is operable to receive at least a portion of light from the light source unit 210 and direct such light in a direction away from the reflective substrate 202 in a manner that provides for uniform intensity and/or color.

A functional gap separates the light source unit 210 from the diffuser layer 220. "Functional gap" in this regard refers to a space having a thickness adequate to permit light entering the space (e.g. at an input plane) to substantially spread out laterally by the time it exits the space (e.g. at an output plane, where the input and output planes define the major boundaries or surfaces of the space). Thus, in general, whether a gap is a "functional gap" depends both on its optical thickness and the degree of collimation of the light entering the gap. The presence of the light extraction element 230 divides the functional gap into a first gap between the light source unit 210 and the extraction element 230, and a second gap between the extraction element 230 and the diffuser layer 220. In some cases each of these first and second gaps are also functional gaps.

For example, in cases where side-emitting light sources that preferentially emit high incidence angle light (e.g. Side Emitting LED packages available from Lumileds Lighting, San Jose, Calif., or other light sources mounted to project light onto the extraction element at high incidence angles) are used as light sources 212, it is desirable to make the first and second gaps both functional gaps of equal or similar thickness.

In other cases it may be desirable to mount the components such that only one of the first and second gaps is a functional gap, and the other gap is as thin as possible, such as the microscopic air gap that normally forms when one optical film is laid atop another optical film. For example, the first gap may be nearly eliminated by placing the extraction element 230 very close to the reflective substrate 202. This may be useful when the light source emits light preferentially in a forward direction, such as with Lambertian emitting LEDs, or other forward emitting LEDs having higher angle emission. Such an arrangement would maximize the second gap between the extraction element and the diffuser layer. It is also possible to mount the extraction element 230 directly on the reflective substrate 202, if the light sources are mounted in recesses or wells formed in the reflective substrate 202. In the case of recesses, the recess can optionally be made of reflective material. Another extreme is where the first gap is maximized and the second gap is nearly eliminated, such as by placing the extraction element 230 against the diffuser layer 220. This may be done by simply placing these two layers in physical contact, thereby leaving a microscopic air gap therebetween, or by affixing the extraction element 230 to the diffuser layer 220 with a thin layer of adhesive. Note that the light sources 212 of the light source unit 210 can protrude above the reflective substrate 202 such as by mounting packaged LEDs so that their encapsulant lenses extend above the reflective substrate.

Turning our attention now to the light extraction element 230, that element includes a first major surface 232 and a second major surface 234. In the illustrated embodiment, the first major surface 232 includes a light extraction surface facing the light source unit 210. Alternatively, in other embodiments, the second major surface 234 of the light extraction element 230 includes a light extraction surface. Further, in some embodiments, both the first major surface 232 and the second major surface 234 can include light extraction surfaces.

The light extraction element 230 may include a light extraction film or layer having structures formed therein to provide a light extraction surface, or the light extraction element 230 may include a film having structures attached to a substrate as is further described herein.

Suitable films and structures can include films and the like having minute structures arranged to form a structured surface or the like that extracts light from the light source unit 210. One or both sides of the film can have such a structured surface. Useful structures include linear prisms, pyramidal prisms, cones, and ellipsoids, which structures may be in the form of projections extending out from a surface or pits extending into the surface. The size, shape, geometry, orientation, and spacing of the structures can all be selected to optimize the performance of the light extraction element 230, and the individual structures can be symmetric or asymmetric. The structured surface can be uniform or non-uniform, and in the latter case both the position and size of the structures can be random or pseudo-random. In some embodiments, the structured surface can include a repeating structural pattern. Disrupting regular features by periodic or pseudo-random variation of size, shape, geometry, orientation, and/or spacing may be used to adjust the color and/or brightness uniformity of the backlight. In some cases it may be beneficial to have a distribution of small and large structures and position the film such that the smaller structures are aligned generally over the light sources and the larger structures are positioned elsewhere. In some embodiments, the structures can be closely packed such that there is minimal land (including arrangements in which there is substantially no land) between structures.

Examples of suitable light extraction films include commercial one-dimensional (linear) prismatic polymeric films such as Vikuiti™ brightness enhancement films (BEF), Vikuiti™ transmissive right angle films (TRAF), Vikuiti™ image directing films (IDF), and Vikuiti™ optical lighting films (OLF), all available from 3M Company, as well as conventional lenticular linear lens arrays. When these one-dimensional prismatic films are used as light extraction films in the disclosed direct-lit backlights, it is usually desirable for the prismatic structured surface to face the light source unit 210.

Further examples of light extraction films, where the structured surface has a two-dimensional character, include cube corner surface configurations such as those disclosed in U.S. Pat. No. 4,588,258 (Hoopman), U.S. Pat. No. 4,775,219 (Appeldom et al.), U.S. Pat. No. 5,138,488 (Szczech), U.S. Pat. No. 5,122,902 (Benson), U.S. Pat. No. 5,450,285 (Smith et al.), and U.S. Pat. No. 5,840,405 (Shusta et al.); inverted prism surface configurations such as described in U.S. Pat. No. 6,287,670 (Benson et al.) and U.S. Pat. No. 6,280,822

(Smith et al.); structured surface films disclosed in U.S. Pat. No. 6,752,505 (Parker et al.) and U.S. Patent Publication No. 2005/0024754 (Epstein et al.); and beaded sheeting such as that described in, for example, U.S. Pat. No. 6,771,335 to Kimura et al.

Figure 7A:
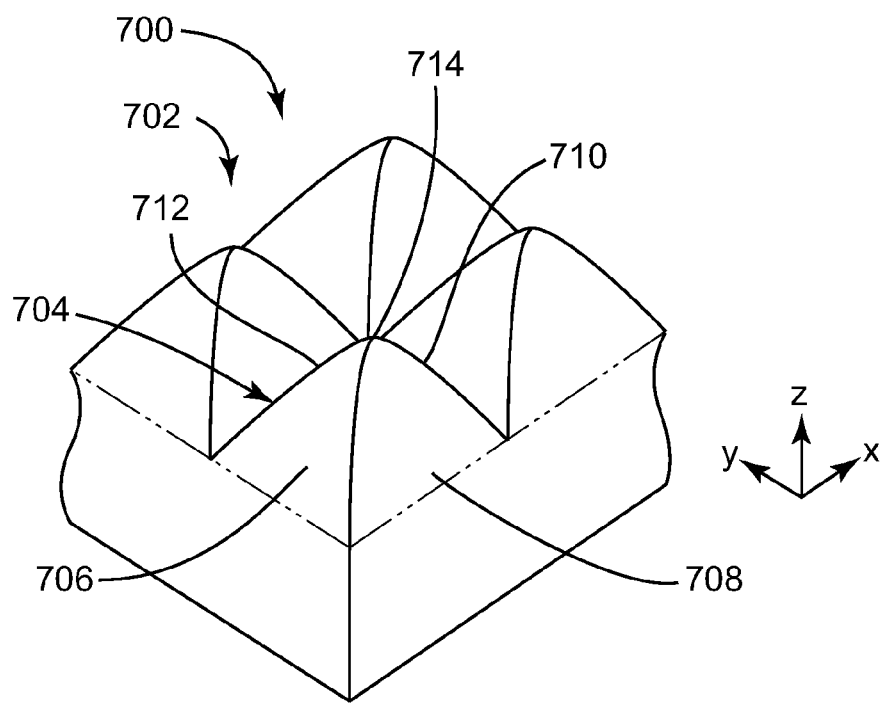
FIG. 7a is a schematic perspective view of one embodiment of a portion of a light extraction film having a structured surface.

One exemplary light extraction film is illustrated in FIG. 7a. The light extraction film 700 includes an array of prisms 702. Each prism includes four curved or arced faces that are arced in both the x-z and y-z planes. For example, prism 704 has four faces 706, 708, 710, and 712, which meet at apex 714. Apex 714 is not a sharp peak. Instead, apex 714 has a fairly round surface, formed by the intersection of arc curves extending in both the x-direction and the y-direction. Although FIG. 7a shows each prism as being symmetrical in both the x-z and y-z planes, the light extraction film 700 may include prisms that are symmetrical in only one plane, e.g., the x-z plane. This asymmetry would cause the prisms to be canted from the z-axis. Film 700 may be manufactured using the techniques described in U.S. Patent Publication No. 2005/0024754 A1 (Epstein et al.).

The prisms 702 of the light extraction film 700 can include any suitable shape for a base in the x-y plane, e.g., square, quadrilateral (e.g., trapezoid, rhombus, parallelogram, rectangle). For a base that takes the shape of a rhombus, the rhombus may include two diagonals that include any suitable lengths and ratios of lengths between the two diagonals. As used herein, the term "diagonal" in relation to a rhombus refers to a line joining any two vertices of a polygon that are not joined by any of its edges, that is, that are not adjacent. In some embodiments, the two diagonals of prism 704 having a rhomboid base may have a ratio of 2:1. In addition, the vertices of the base may be rounded or sharply defined.

The prisms 702 may be closely packed such that there is minimal land between prisms; alternatively, the prisms 702 may be spaced apart any suitable distance such that the film 700 includes lands between prisms 702.

Figure 7B:
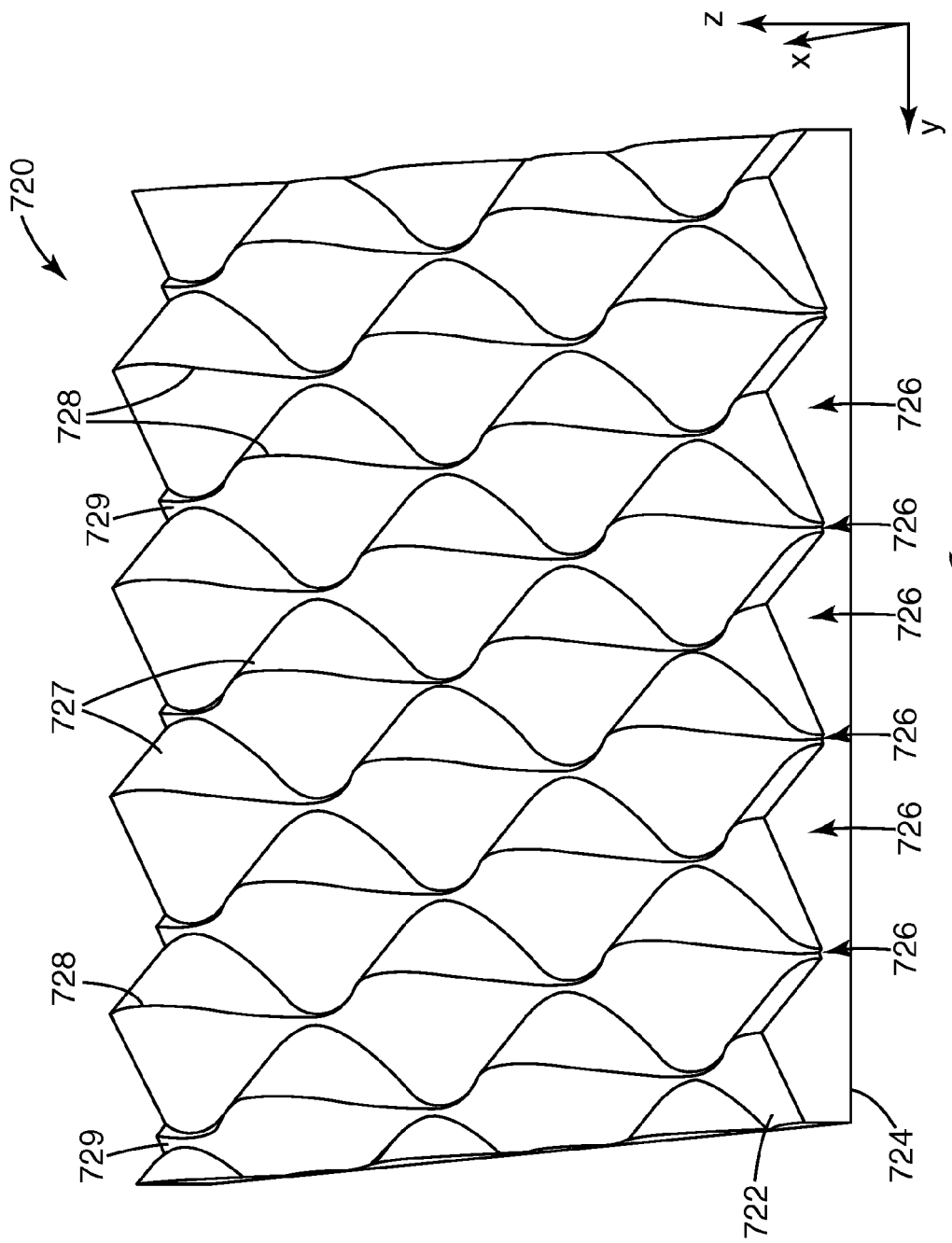
FIG. 7b is a schematic perspective view of another embodiment of a portion of a light extraction film having a structured surface.

Another exemplary light extraction film is depicted in the fragmentary perspective view of FIG. 7b. There, a film 720 has a structured surface 722 disposed opposite a smooth surface 724. Structured surface 722 comprises an array of elongated prisms 726. The prisms 726 may be continuous or discontinuous, and substantially continuous prisms are particularly preferred. In this context substantially continuous means that each prism 726 extends the entire length of the light extraction film. The height and width of each prism may vary widely, and in the embodiment shown in FIG. 7b each prism has a height and a width that undulate along the length of the prism. The undulations are substantial enough to form alternating major portions 727 and minor portions 729 arranged continuously along the length of each prism 726. This substantial undulation adds curvature to the structured surface in the plane of the structured surface (the x-y plane), which as discussed further below can help spread light transmitted by the film in a controlled manner into a range of azimuthal angles if the film is properly oriented relative to the light source, i.e., with its structured surface 722 facing the light source. Further, in this embodiment adjacent prisms 726 are out-of-phase or shifted relative to each other such that a minor portion 729 of a given prism is flanked by major portions 727 of its adjacent prisms, and a major portion 727 of a given prism is flanked by minor portions 729 of its adjacent prisms, although such an out-of-phase arrangement is not required. In this embodiment the prisms form a continuous interlocking array with substantially no intervening flat land areas between prisms. However, such an interlocking arrangement is not required—i.e. some land areas may exist between prisms, although minimal land areas are preferred.

Figure 7C:
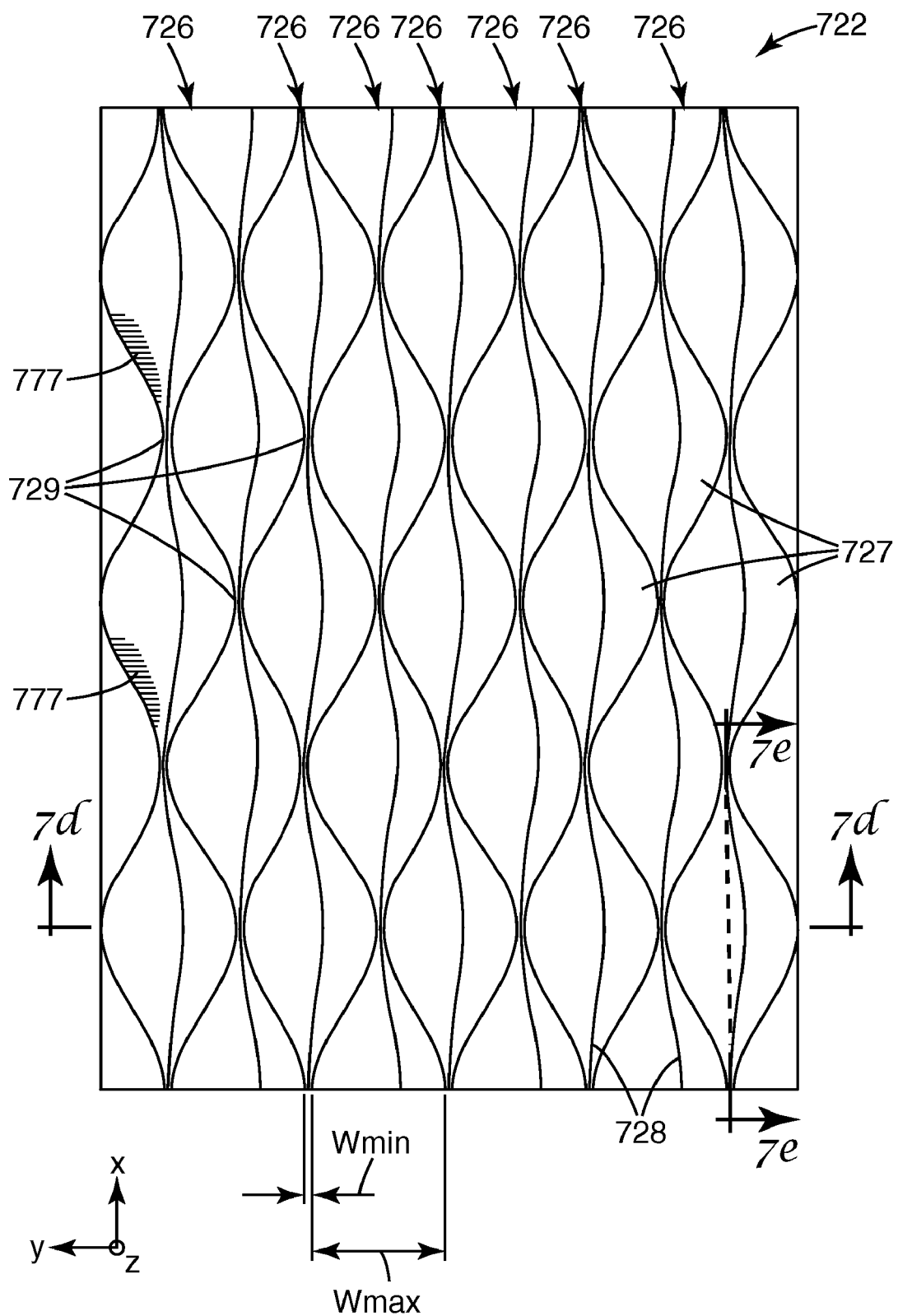
FIG. 7c is a top plan view of the film of FIG. 7b.

The shape or outline of the prism bases preferably possess a symmetry to permit this interlocking (e.g. as shown in FIGS. 7b-c), so that two prisms 726 of substantially identical shape can mate along a common border with substantially no land or gap between them. The prisms 726 each comprise two inclined surfaces that meet to form a continuous undulating ridge 728.

Figure 7D:
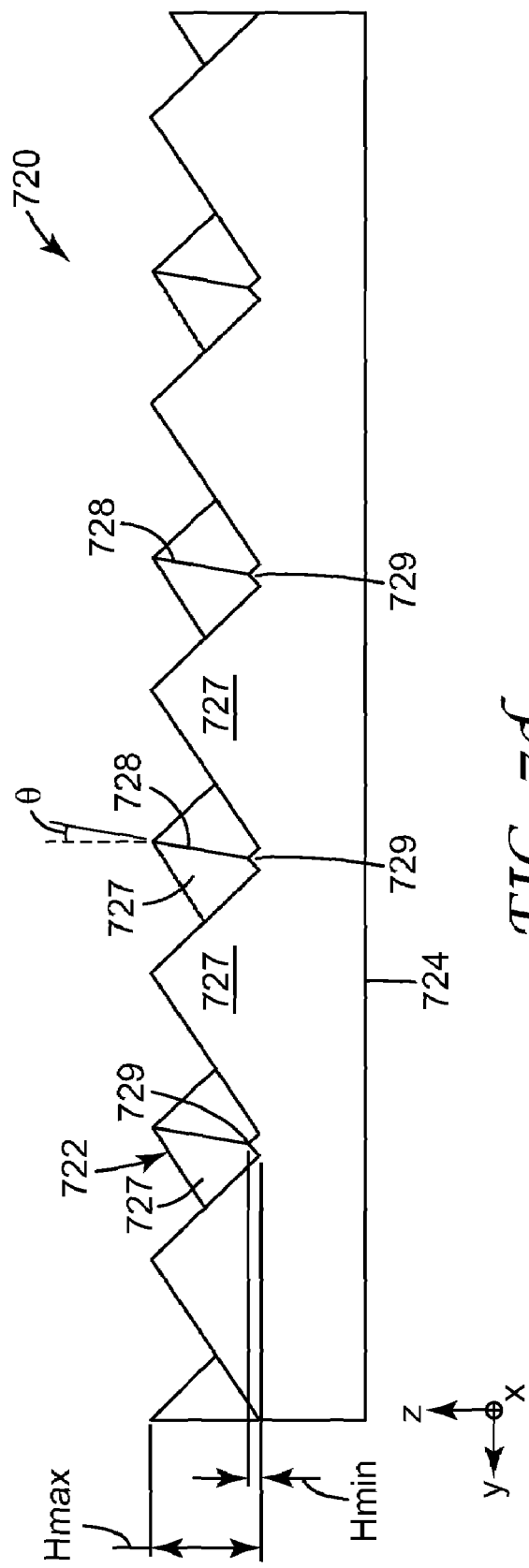
FIGS. 7d and 7e are sectional views of the film of FIGS. 7b-c, where
Figure 7E:
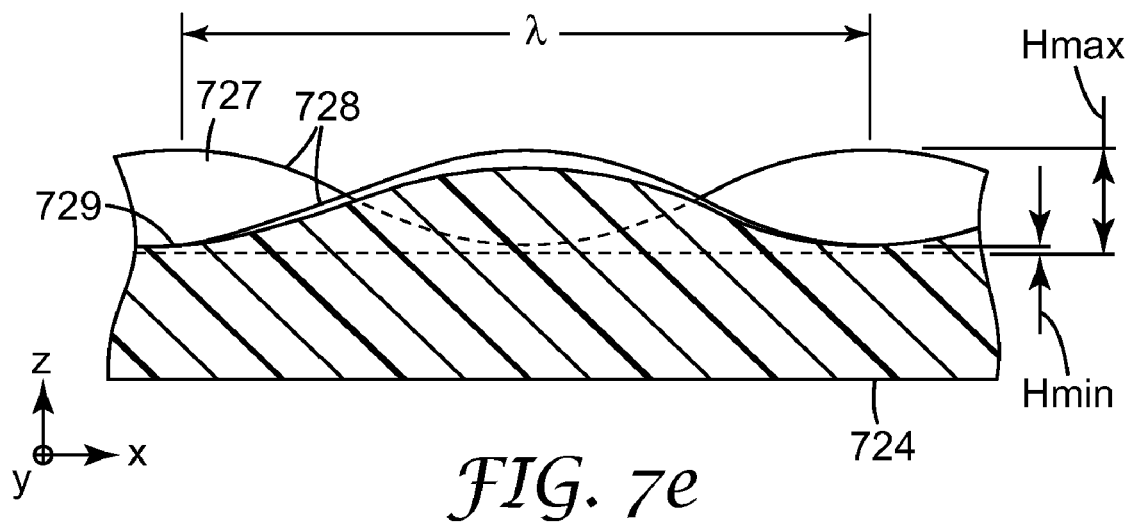

A fragmentary plan view of film 720 and its structured surface 722 is shown in FIG. 7c, and corresponding sectional views along cut lines 7d-7d and 7e-7e are provided in FIGS. 7d and 7e respectively. In these views it can be more clearly seen that although prisms 726 possess the interlocking symmetry mentioned above, each prism 726 has a structural asymmetry as shown by the different sizes and different inclinations (relative to the x-y plane or surface 724) of the two inclined surfaces of each prism, such that the undulating ridge 728 formed therebetween does not lie in the x-z plane, or in any plane perpendicular to the overall structured surface 722 or to surface 724. Instead, the ridge 728 substantially lies in a plane tilted at an angle θ relative to the x-z plane as best seen in FIG. 7d, with θ being a measure of the degree of cant of the prism. Another result of this prism cant is that the continuous ridge 728 of a given prism is not linear but instead undulates in plan view. From an optical performance standpoint the prism cant can cause the structured surface to have light extraction properties that are asymmetric relative to the x-z plane, i.e., relative to a plane normal to the film 720 and parallel to the prism direction. This may be desirable or not depending on the intended application of the film. Note that the prisms can also exhibit a tilt or cant relative to the y-z plane, wherein such tilt or cant is measured in the x-z plane.

As mentioned above, prisms 726 have a height and width that undulate enough to form identifiable major and minor portions 727, 729 along the length of a prism. In FIG. 7c the maximum and minimum width of a prism 726 are labeled Wmax and Wmin respectively. The ratio Wmax/Wmin may be, for example, at least 2, 5, 10, or 20 or more. Width in this regard is measured perpendicular to the length of the prism and from the outer boundary or edge of one inclined prism surface to the outer boundary or edge of the other inclined prism surface. In FIG. 7c, Wmax/Wmin is about 20. The height of prisms 726 also undulates between a maximum height Hmax to a minimum height Hmin. Height in this regard is measured along the z-axis from the lowest point or vertex on the structured surface to the ridge 728 or other top of the prism, at any given point along the prism. The ratio Hmax/Hmin may be, for example, at least 2, 5, 10, or 20 or more. In FIGS. 7d and 7e, Hmax/Hmin is about 20. Preferably the height undulates uniformly to provide a characteristic length λ between adjacent maxima or adjacent minima of the ridge 728 as shown best in FIG. 7e.

An in-plane aspect ratio can be defined by the ratio of λ/Wmax. There is wide latitude in selecting this aspect ratio, but in exemplary embodiments it is in a range from about 1 to 5. The aspect ratio for structured surface 722 is about 2.

This surface topography described in FIGS. 7b-7e above, referred to herein as "azimuthal beam widening topography," has particular utility in direct-lit backlight systems where the light extraction film is positioned in a gap between an array of discrete light sources and a diffuser plate, with the structured surface of the light extraction film facing the light sources so as to spread light emitted by those light sources onto the diffuser plate uniformly.

The topographies described in FIG. 7a-7e above are merely exemplary, and, depending on the intended application, many other light extraction surface designs may be used. For example, other exemplary light extraction surface designs are shown in the following publications, which are incorporated herein by reference: WO 2005/120791, WO 2006/031483, US 2005/0122591, US 2005/0280752, and US 2006/0092490.

Figure 12:
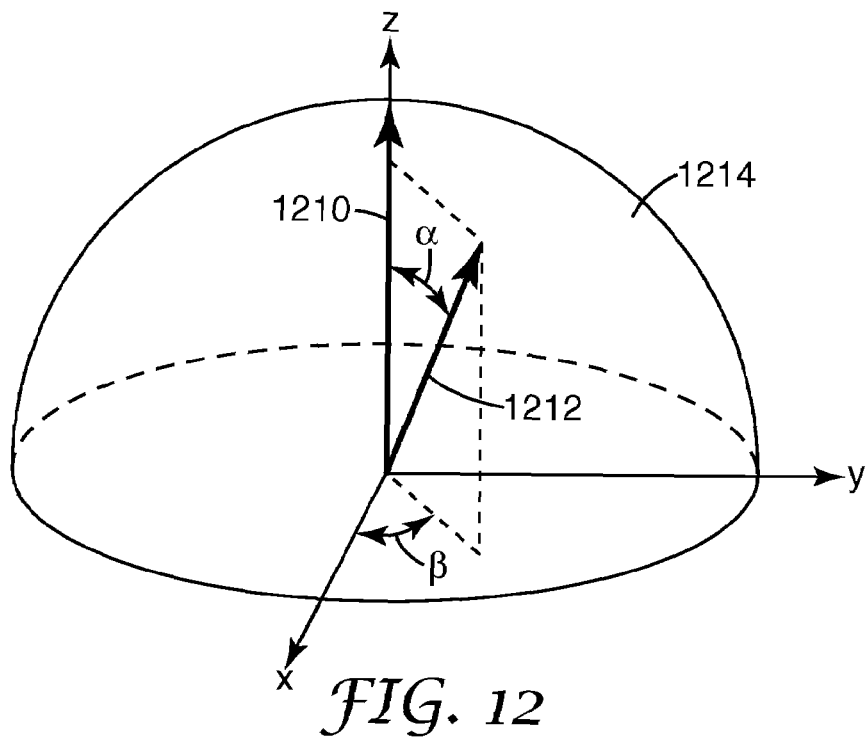
FIG. 12 is a perspective view of a polar coordinate system.

For reference purposes, FIG. 12 shows a polar α-β-z coordinate system superimposed on a Cartesian x-y-z coordinate system. It is convenient to select a unit vector 1210 along the z-axis to represent the direction of a collimated input light ray that is incident on a light extraction film. If the incident light direction is perpendicular to the extraction film, then the film can be represented by the x-y plane. The direction of the light diverted by the extraction film can, in simple cases, be represented on the same coordinate system by another unit vector 1212 on the unit sphere 1214 (only the upper hemisphere of which is shown in the figure). The direction of the diverted light can thus be specified by polar coordinates (α, β), where α is the polar angle measured from the z-axis (having possible values from 0 to 90 degrees or 0 to π/2 radians), and β is the azimuthal angle measured between the x-axis and the plane containing unit vectors 1210 and 1212 (having possible values from 0 to 360 degrees or 0 to 2π radians).

Figure 13A:
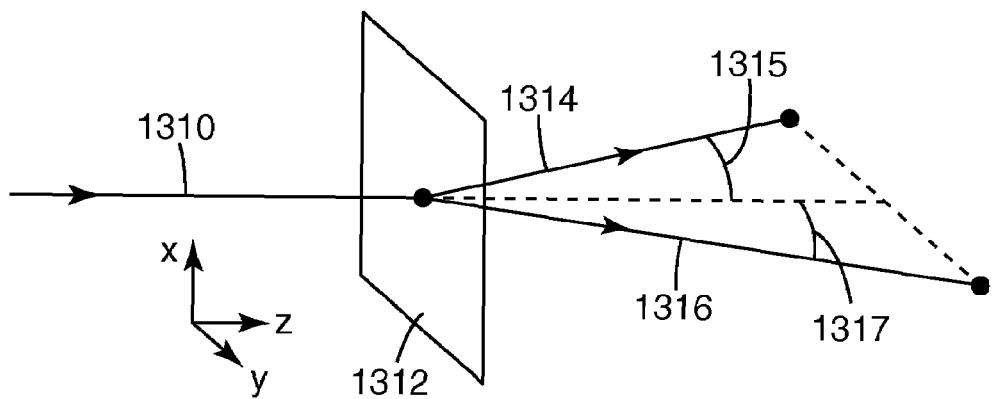
FIGS. 13a-c are perspective views of setups demonstrating the light deflecting properties of different types of light extraction films, including in FIG. 13c light extraction films that produce azimuthal beam widening.

Light extraction films disclosed herein convert a collimated incident light beam (whose cross-sectional area is sufficiently large to illuminate a representative area of the light extraction film's structured surface) into one or more diverted beams. For example, FIG. 13a shows a collimated incident light beam 1310 normally incident on a light extraction film 1312, where the film 1312 is a conventional BEF film having a structured surface facing the incident light and a smooth opposing surface, the structured surface having an array of simple linear prisms extending parallel to the x-axis. The (flat) angled facets of the prisms deflect the incident light to produce deflected beams 1314, 1316 that are directed at equal angles 1315, 1317 with respect to the z-axis. Because the structured surface lacks any substantial flat land areas between prisms, little or no output beam is observed along the original direction, the z-axis. The angles 1315, 1317 are polar angles analogous to angle α of FIG. 12. By tailoring the included angle between prism facets on the structured surface, angles 1315, 1317 can be changed, and more or less diverting of the beams can be accomplished.

Figure 13B:
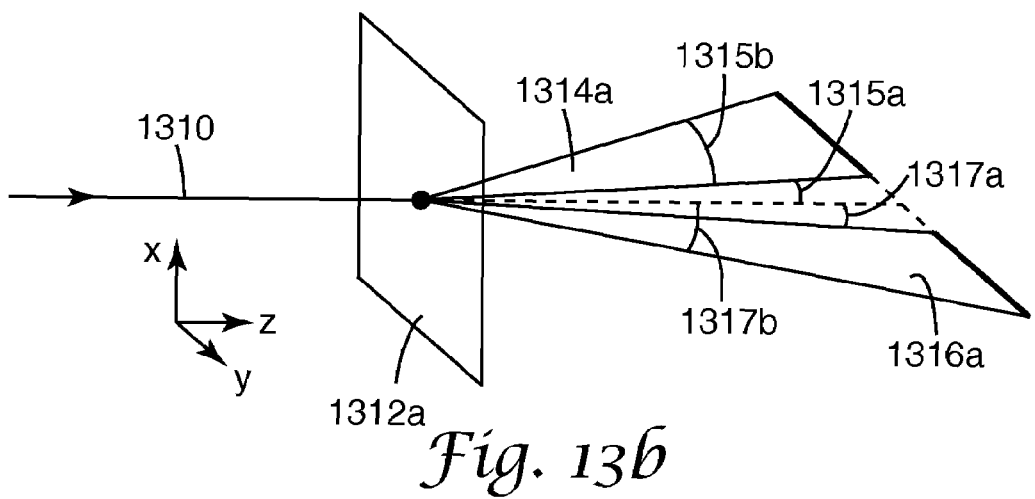

Regardless of the angle between prism facets, however, the topography of an array of simple linear prisms produces only two diverted beams directed along two distinct directions. If, in order to achieve more light mixing or blurring in the backlight, more diverting directions are desired, the facets of the linear prisms can be changed from flat to curved in a sectional plane perpendicular to the length of the prisms. The effect of such curvature can be seen in FIG. 13b, where conventional BEF film 1312 has been replaced with a light extraction film 1312a similar in all respects to film 1312 except the flat prism faces have been given a substantial curvature in the y-z plane. The curvature yields a smoothly varying surface normal direction in the y-z plane over two non-overlapping ranges, which in turn yields widened diverted beams 1314a, 1316a. The beams 1314a, 1316a are referred to as "widened" because they each extend substantially continuously (above a given threshold light intensity or background level, such as a percent of peak intensity) over a significant range of angles. In the case of FIG. 13b, those angles range from 1315a to 1315b for beam 1314a, and from 1317a to 1317b for beam 1316a. All of those angles, however, are polar angles analogous to angle α of FIG. 12, and thus the angular width of the widened beams is entirely in the polar direction. The curvature of the prism facets has produced no widening of the diverted beams in the azimuthal direction.

Figure 13C:
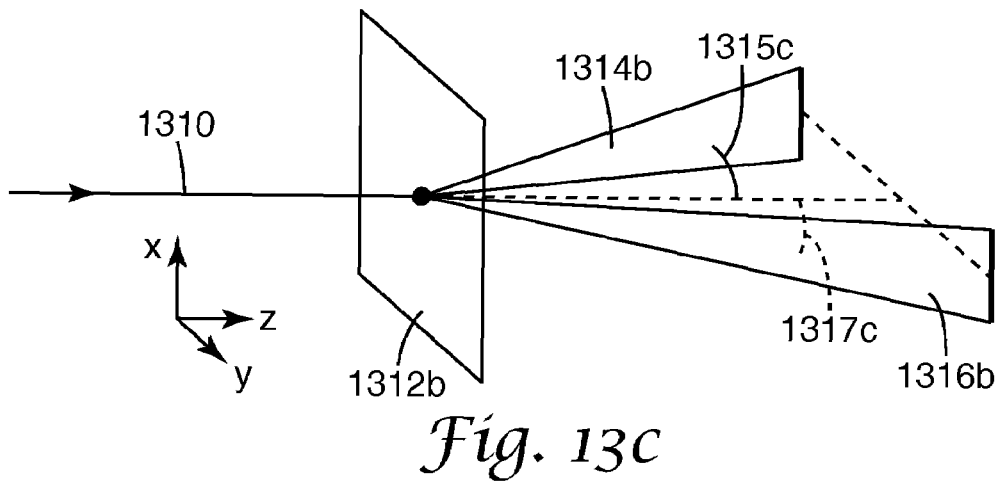

Turning now to FIG. 13c, we see there the behavior of a light extraction film that has an azimuthal beam widening topography. FIG. 13c is similar to the setup of FIG. 13a except that the light extraction film 1312 has been replaced with light extraction film 1312b, which is substantially identical to film 720 described in connection with FIGS. 7b-e. The film 1312b is oriented such that its structured surface faces the incident light and the prisms extend parallel to the x-axis. As discussed previously, the significant undulation of the prisms on the structured surface produces significant curvature in the plane of the structured surface (the x-y plane) rather than curvature in the perpendicular y-z plane as was seen in connection with FIG. 13b. This in-plane curvature is then responsible for producing widened diverted beams 1314b, 1316b as a result of the smoothly varying surface normal direction (projected onto the x-y plane). Beams 1314b, 1316b are widened, but in an azimuthal direction perpendicular to the polar deflection angles 1315c, 1317c as can be seen in the figure. The amount of widening in the azimuthal direction can be controlled by the amount of in-plane curvature present in the structured surface, which in turn can be controlled by the severity of the undulations as indicated by the ratios Wmax/Wmin, Hmax/Hmin, and λ/Wmax discussed previously.

Figure 14:
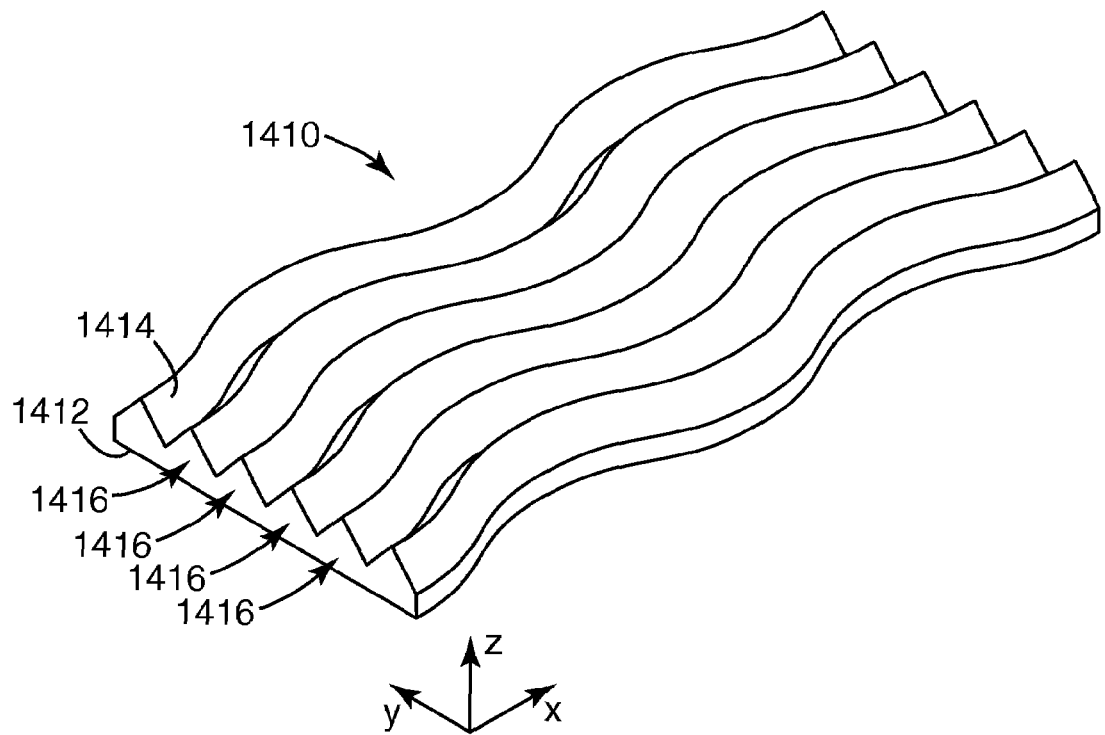
FIG. 14 is a schematic perspective view of another embodiment of a portion of a light extraction film having a structured surface.

Another structured surface capable of exhibiting azimuthal beam widening is shown in FIG. 14. There, a portion of a light extraction film 1410 is shown having a smooth major surface 1412 and an opposed structured surface 1414. The structured surface comprises or consists essentially of an interlocking array of serpentine prisms 1416, each of which can extend over the entire length of the light extraction film. Like the prisms 726 of structured surface 722 (FIGS. 7b-e), each prism 1416 comprises two inclined prism faces that meet to form a ridge. But unlike prisms 726, each prism 1416 undulates back and forth in the y-direction while maintaining a substantially constant width and height. The undulation can be sinusoidal or any other smoothly varying function (or non-smooth function or combination of smooth and non-smooth functions), preferably selected to provide the prisms 1416 with interlocking symmetry so that substantially identical prisms can be close-packed on the surface 1414 with substantially no flat land areas between prisms. Referring to the setup of FIG. 7f, grooves to create the prisms can be made on a master tool by maintaining a constant cutting depth but oscillating the tool parallel to direction 742. The serpentine topography produces curvature in the plane of the structured surface (the x-y plane), and the amount of curvature can be controlled by the severity of the undulations. The amount of in-plane curvature can be used to control the amount of azimuthal beam widening when the film 1410 is oriented such that structured surface 1414 faces the light source unit of the backlight.

Besides structured surface 722 of FIGS. 7b-e, and structured surface 1414 of FIG. 14, another structured surface that can exhibit azimuthal beam widening is an array of conical structures. The conical structures can be arranged in a triangular, diamond, or hexagonal plan view arrangement, and are preferably close-packed and intersecting such that the structured surface is devoid of flat land areas, to substantially avoid direct (non-diverted) transmission of normally incident light through the light extraction surface.

The bases of the conical structures lie in the x-y plane of the light extraction surface, and the apexes of the structures lie outside the x-y plane. The bases may have a wide variety of shapes, including, for example, circular, elliptical, and hexagonal. The sides of the conical structures, which intersect to form the apex, may be linear, or may include curvature, so the conical structures can have circular or elliptical cross-sections in a plane parallel to the x-y plane of the structured surface. The apexes of the individual cones in the array can be canted or non-canted (i.e. the apexes can lie within or outside of a plane normal to the x-y plane).

In contrast to the two distinct (curved) prism faces of structured surfaces 722 and 1414, which give rise to two distinct azimuthally widened output beams, in the case of a conically structured surface the 360° continuity of curvature (i.e., the circular or elliptical cross sectional shape) in the plane of the structured surface yields a continuous ring-shaped output beam that covers a full 360° in azimuthal angle.

The light extraction surface including the array of conical structures may be provided in a variety of forms, but polymeric films are particularly preferred for use in backlit LED systems such as those described in FIG. 2. Such films may be made by forming an appropriately shaped tool using, for example, an ELMOF apparatus, and utilizing the tool to make the polymeric film by a casting, coating or compressing process.

Of course, structured surfaces configured to provide substantial azimuthal beam widening can also incorporate features to produce polar beam widening. Thus, for example, the structured surface 722 of FIGS. 7b-e, the structured surface 1414 of FIG. 14, and the conical array structured surface described above can be provided with facet curvature in a plane perpendicular to the plane of the structured surface (e.g., in the y-z plane of FIG. 7b and in the y-z plane of FIG. 14). In the cases of FIGS. 7b-e and 14, this can be done by manufacturing the master tool using a diamond cutting tool having curved cutting surfaces. This type of surface curvature provides beam spreading along the polar direction as depicted in FIG. 13b. Thus, by configuring the structured surface to have both substantial in-plane curvature and curvature in a perpendicular plane, the polar beam widening of FIG. 13b and the azimuthal beam widening of FIG. 13c can be combined.

Other structured surfaces capable of producing azimuthal beam widening may utilize elements that have only one faceted surface that has an in-plane (x-y plane) curvature, or elements that have exactly two (FIGS. 7b-e and FIG. 14), three, four, or, in general, N such distinct surfaces. The N distinct surfaces may also be distributed among a plurality of elements on the structured surface (e.g. an array of 3-sided prisms that are randomly tilted relative to each other). Such elements will yield a corresponding number N of distinct beams each of which is widened in the azimuthal direction. Furthermore, in-plane curvature can be approximated by a large number M of distinct non-curved (flat) facets arranged at different angles in the plane of the structured surface to yield the same large number M of narrow distinct deflected beams spaced closely together in the azimuthal direction to approximate azimuthal light spreading. Therefore, with regard to beam widening in the azimuthal direction, it is desirable that the sum of the azimuthal widths $\Delta\beta$ of all deflected beams (where beam width is defined by a given threshold light intensity or background level, such as a percent of peak intensity, and measured as a difference in azimuthal angle $\Delta\beta$) produced by a normally incident beam (whose cross-sectional area is sufficiently large to illuminate a representative area of the light extraction film) is at least 15°, and preferably is at least 30°, 60°,120°, or 180° or more.

As discussed above, it is often desirable for the light extraction film to provide little or no direct (non-diverted) transmission of normally incident light in order to avoid bright areas known as hot spots from appearing above the light sources. Instead, the normally incident light is diverted at least in the polar direction (and preferably also widened in the azimuthal direction). In this regard, the light extraction film preferably redirects most of the normally incident light (whose cross-sectional area is sufficiently large to illuminate a representative area of the light extraction film) such that less than 9%, less than 20%, less than 35%, or less than 50% of the transmitted light is transmitted within a region whose polar angle $\alpha$ (measured relative to the incident light direction, see FIG. 12) is 10°, 15°, 20°, or 25° respectively. Alternatively, at least 91%, at least 80%, at least 65%, or at least 50% of the transmitted light is transmitted outside of a region whose polar angle $\alpha$ is 10°, 15°, 20°, or 250° respectively. These relationships, which are consistent with a requirement that the light extraction film scatter normally incident light more strongly (at greater polar angles) than an ideal Lambertian diffuser, also preferably apply to nearly normally incident light whose incidence angle is less than 5, 4, 3, 2, or even 1 degree.

While it is desirable for the light extraction films to divert normally incident light to oblique polar angles, it is also desirable for them to divert highly oblique incident light to angles that are less oblique and more aligned with the surface normal direction of the film.

The deflective behavior illustrated in FIGS. 13a-c can be demonstrated by shining a collimated light source (such as the beam from a conventional laser pointer) at a given extraction film and observing the transmitted light pattern. This observation can be done to a degree of approximation by directing the transmitted light onto a screen such as a white card or sheet of paper. More accurate measurements can be made using a device capable of measuring the angular distribution of light such as a goniometric radiometer or photometer or conoscope, for example, the ConoScope series of instruments available commercially from autronic-MELCHERS GmbH, Karlsruhe, Germany.

Figure 7F:
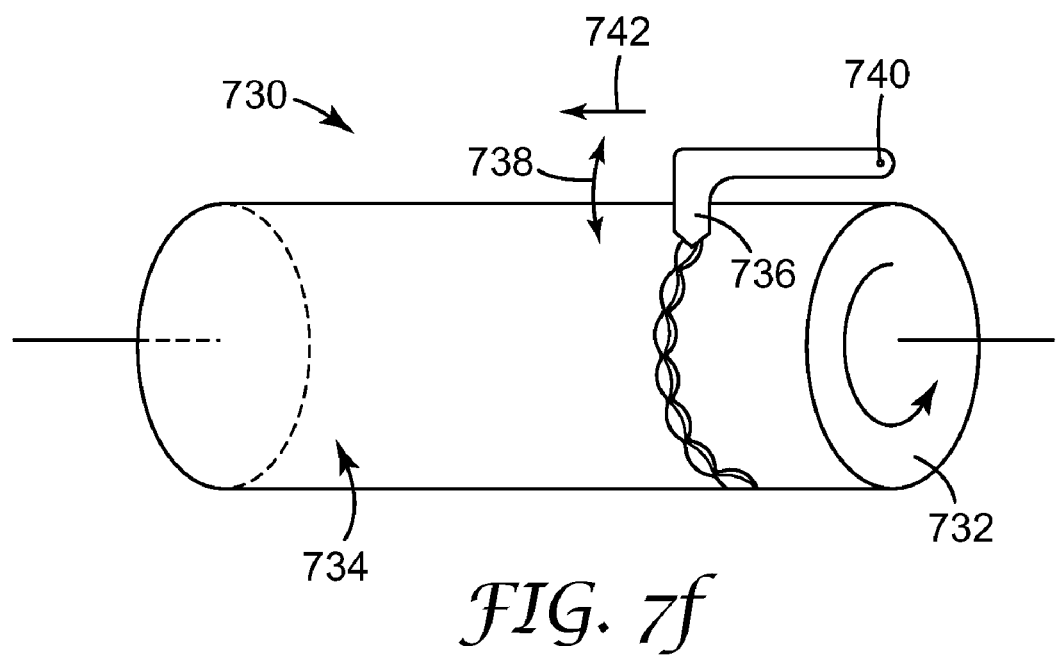
FIG. 7f is a schematic representation of a setup capable of making a master tool for use in making extraction films such as that of FIG. 7b.

Structured surface 722 can be conveniently made using a tool having the negative geometry of the structured surface, i.e., pits in place of protuberances and protuberances in place of pits. FIG. 7f shows schematically a setup 730 for making such a tool. A roller 732 is provided with at least a thin outer layer of machinable material, such as electroformed hard copper or other suitable material. The roller is then placed in a diamond turning machine and the entire cylindrical surface 734 machined to a mirror smooth surface using diamond cutters having finely formed cutting edges. The diamond cutters desirably exert very little compression force, resulting in little work hardening of the machinable material. After this, undulating grooves are cut in the surface 734 using a precisely shaped diamond tool 736 whose motion and orientation relative to the surface are carefully controlled. In the figure the depth of cut is controlled by a rotational motion 738 about a pivot point 740, such as is found in conventional engraving machines, but a purely translational motion such as provided by a linear mount fitted with piezoelectric actuators can also be used. Engraving machines can utilize a ceramic shoe (not shown) that rests on the uncut metal surface upstream of the diamond cutting tool, the shoe serving as a reference for the cutting tool to permit high cutting accuracy. The cutting tool also has a lateral motion control to advance the tool along a direction 742 parallel to the axis of rotation of the roller 732. The rotational speed of the roller 732, the depth control of the diamond tool, and the lateral motion of the diamond tool are synchronized to provide the desired tool geometry. In one approach, the lateral motion is slow but constant such that the diamond tool cuts a single continuous groove that wraps around the cylindrical surface 734 in an imperceptibly gradual spiral. Simultaneously, the cutting depth is varied sinusoidally and at a frequency relative to the rotational speed of the roller so that adjacent cuts are out of phase with each other, thus producing the interlocking pattern seen in FIG. 7c.

Many variations in the cutting technique are possible, leading to many variations in the structured surface geometry of the extraction film. The cutting tool, whose shape controls the cross-sectional shape of the prisms, may have a tip that is sharp, rounded, or flat, and can have other cutting facets that are flat or non-flat (such as rounded). The mounting orientation of the cutting tool can be orthogonal to the local cutting surface to produce symmetrically-shaped prisms, or tilted to produce canted prisms. The motion controlling the depth of cut can be a simple sinusoid or a more complex waveform, e.g. combinations of low and high frequency sinusoids, waveforms with discontinuous first derivatives such as a triangle wave, and so forth. Tool chatter, discussed below, adds high frequency ridges or striations to the (typically) lower frequency depth waveform. The transverse motion (direction 742) of the cutting tool may be constant or non-constant, and may be such as to preserve regions of the original mirror-smooth surface between adjacent cuts, thus yielding flat land areas between prisms on the finished extraction film.

During the cutting of the master, tooling marks or chatter may be formed in the machinable material of the master. Such marks may appear in the microstructured film made from the master as a series of high frequency striations or ripples on one or more faces and/or vertices (ridges) of the microstructures. The striations, examples of which are labeled in FIG. 7c with reference numeral 777, may cover the entire face or they may cover only a portion of the face. Typically, these striations will run perpendicular to the tool cutting direction. The striations may be present on every microstructure or only on some of the microstructures. In most microreplicated films these striations are undesirable, and precautions are taken to eliminate them during the fabrication of the master tool. However, in the case of light extraction films the striations can be used beneficially to increase the range of angles into which the transmitted light is refracted, thereby further enhancing the controlled light deflection of the extraction film.

Striations that lie generally in the tool cutting direction can also be formed, for example by using a diamond cutting tool that has notched, roughened, or serrated (scalloped) faces.

Whether or not diamond cutting is used to manufacture the master tool, post processing methods can also be used to roughen or texture the faces of the microstructures. Such methods include etching or abrading the master after the nominal pattern has been formed, or by plating the master with a coating having a desirable roughness.

After the tool has been fabricated, it can be used as a mold to make structured surface films as is known in the film-making art. For example, a curable composition can be coated onto the finished tool surface, cured, and stripped away to yield a finished film. A base film can also be used with the curable composition to provide prisms 726 or other structures composed of the cured transparent material attached to a flat base film composed of a different transparent material.

Figure 7G:
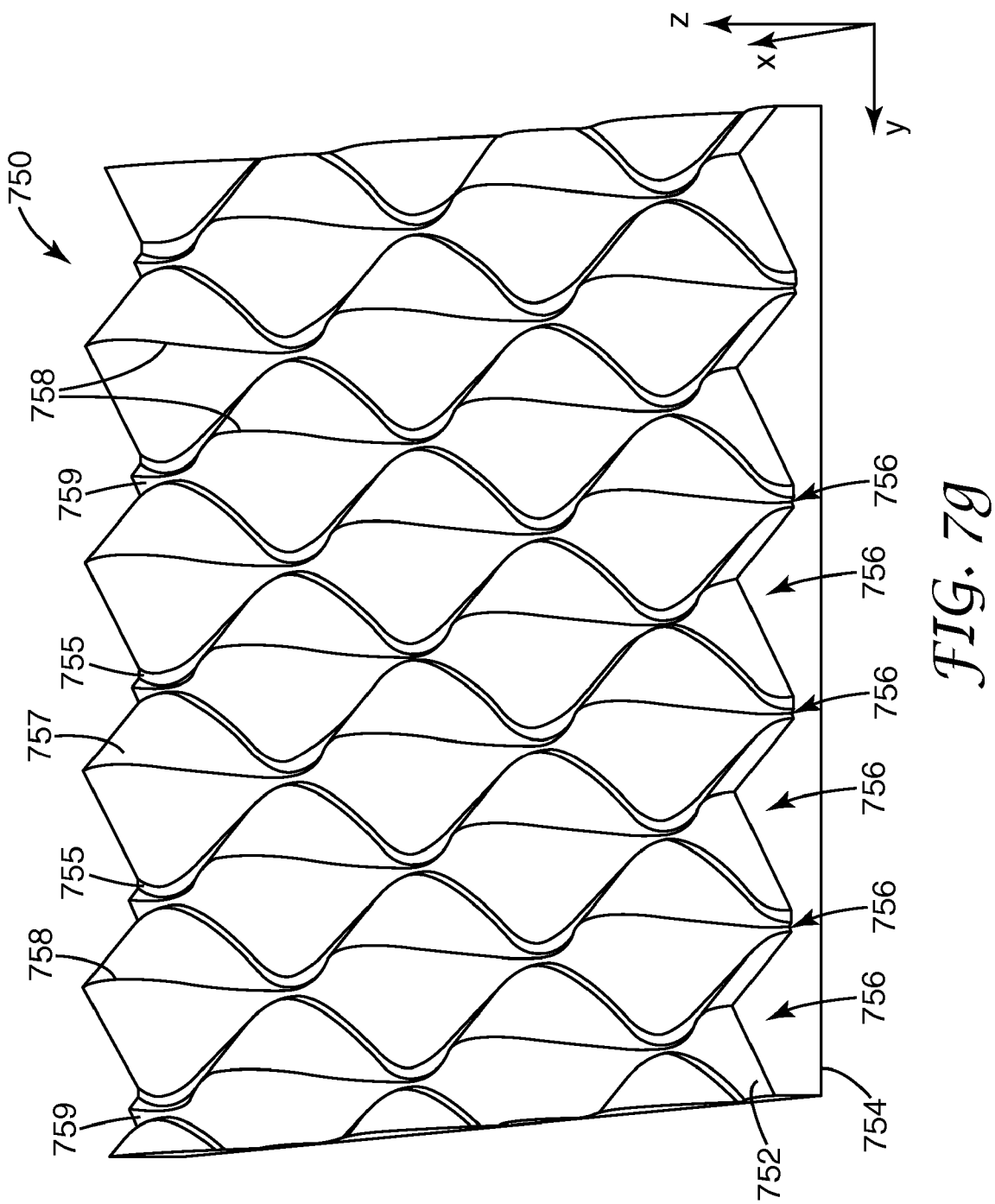
FIG. 7g is a schematic perspective view of another embodiment of a portion of a light extraction film having a structured surface.

FIG. 7g shows another exemplary light extraction film 750 in fragmentary perspective view. Film 750 is similar in many respects to film 720. For example, film 750 has a structured surface 752 disposed opposite a smooth surface 754, the structured surface comprising an array of elongated continuous prisms 756 whose height and width undulate along the length of the prism sufficiently to form alternating major portions 757 and minor portions 759 arranged continuously along the length of each prism 756. Prisms 756 also have continuous undulating ridges 758. Adjacent prisms 756 are out-of-phase or shifted relative to each other such that a minor portion 759 of a given prism is flanked by major portions 757 of its adjacent prisms, and a major portion 757 of a given prism is flanked by minor portions 759 of its adjacent prisms. However, unlike film 720, film 750 has flat land areas 755 separating adjacent prisms. Moreover, the flat land areas 755 are non-uniform in width, meaning that the shape or outline of the prism bases for prisms 756 do not possess precise interlocking symmetry.

Some light extraction films have retroreflective characteristics. Such films are capable of returning substantial quantities of incident light back towards its source, this property being maintained over a wide range of directions of incident light. Retroreflective films have, therefore, become commonly used on road signs, barricades, and safety vests. For example, films having cube-corner configurations typically employ several cube corner elements to retroreflect incident light. The cube corner elements project from a back surface of a body layer. In this configuration, incident light enters the film at a front surface of the body layer, passes through the body layer to be internally reflected by the faces of the cube corner elements, and subsequently exits the front surface to be returned towards the light source. Exemplary light extraction films that may exhibit retroreflectivity include 3M™ Scotchlite™ Reflective Material 6260 High Gloss Film. These films, like most retroreflective films, have retroreflective characteristics for light incident on one major surface of the film but not for light incident on the other major surface of the film. When used as light extraction films, such as, for example, in the arrangement of FIG. 2, the retroreflective film is preferably oriented so that light striking the film from below (light from light sources 212 incident on first major surface 232) is not retroreflected, while light striking the film from above (e.g. light reflected from diffuser layer 220, incident on second major surface 234) is retroreflected.

Other light extraction films may be non-retroreflective, i.e., the films are not capable of returning substantial quantities of incident light back towards its source. Exemplary non-retroreflective films include those films described in U.S. Pat. No. 5,948,488 (Marecki et al.), and the films described in connection with FIGS. 7a-g above.

The light extraction element 230 can be used alone or in combination with other suitable films or layers. If used in combination with a different type of film, the light extraction element 230 can be positioned adjacent the light source unit 210, and the other film, which may be a semi-reflecting film (e.g., diffusers, reflecting polarizers, perforated multilayer optical reflecting films, etc.) or another light extraction element, can be positioned such that the light extraction element 230 is between the light source unit 210 and such film. For example, as shown in FIG. 2, the other film is a diffuser 220, a reflective polarizer may be positioned between the diffuser 220 and the light extraction element 230, or between the light extraction element 230 and the light source unit 210.

If two or more linear prismatic light extraction elements are combined, they can be aligned, misaligned, or "crossed" such that the prism direction of one element is perpendicular to the prism direction of the other element.

It is also not necessary that the light extraction element and the other films be the same size or have the same configuration. For example, the reflective polarizer, the light extraction element and/or the diffuser may have a size and shape selected to match the arrangement of light sources 212 in the light unit 210.

In some cases, including diffuse or reflective dots over the LEDs may further improve the brightness and color uniformity. For example, adding reflective strips, such as those described in U.S. Patent No. 2004/0233665 (West et al.), to the extraction film can provide improved blocking of the direct emission from the LEDs.

The illumination assembly 200 can also include one or more optional light management films 240 positioned to receive illumination light that passes through the light extraction element 230 and the optional diffuser layer 220. Any suitable film or films may be included in the light management films 240, e.g., one or more of the films described for light management unit 140 of FIG. 1.

As previously mentioned herein, the light extraction element 230 is operable to direct at least a portion of illumination light from the light source unit 210 in a direction away from the reflective substrate 202 such that the resulting illumination light that leaves the illumination assembly 200 exhibits greater color and/or intensity uniformity. For example, illumination light 214, propagating from the light sources 212 in a direction generally parallel to the axis 250, is diverted at the light extraction element 230 by light extraction surface 232. The light extraction element 230 changes the direction of the exiting light relative to the direction of the incident light. Consequently, after passing through the light extraction element 230, the light 214 propagates in a direction non-parallel to the axis 250. In other words, the light extraction surface 232 deterministically diverts a propagation direction of at least a portion of the illumination light 214 passing from the light source unit 210 to the optional diffuser layer 220 as the illumination light 214 passes through the light extraction surface 232. To accomplish this redirection of light, the light extraction surface 232, for example, may be a refracting surface or a diffracting surface. In most cases, holographic structures can be used to approximate the optical behavior of a given physically microstructured surface. Hence, each of the microstructured surfaces disclosed herein has a holographic counterpart.

By diverting light that is propagating in a substantially parallel direction to the axis 250 to a non-parallel propagation direction, the light extraction element 230 more evenly distributes light from a particular light source 212, thereby making the backlight's output more uniform in intensity and/or color.

In some embodiments, the light extraction element 230 can also extract illumination light traveling at high propagation angles to the axis 250 and direct such high angle light away from the reflective substrate 202. For example, illumination light 216 is emitted by light source 212*a* at a high angle to the axis 250. The light extraction surface 232 of the light extraction element 230 extracts light 216 and directs it at a lesser propagation angle toward the optional diffuser layer 220. By extracting high angle light, the light extraction element 230 can further promote color mixing and/or intensity uniformity by more evenly distributing light from a particular light source over a larger area of the illumination assembly 200 output.

Further, in some embodiments, the light extraction element 230 is operable to reflect a portion of illumination light back toward the reflective substrate 202. For example, illumination light 218 is emitted by light source 212*b* and propagates at an angle to the axis 250 toward the light extraction element 230. The light extraction surface 232 in turn reflects the illumination light 232 back toward the reflective substrate 202. Upon reaching the reflective substrate 202, the light 218 is either specularly or diffusely reflected back toward the light extraction element 230. This reflection by the light extraction element 230 and reflective substrate 202 can provide color mixing by distributing light from particular light sources more effectively over a larger area of the illumination assembly 200 output.

Although not shown, the assembly 200 can also include reflective walls that are substantially orthogonal to the reflective substrate 202. In some embodiments, such reflective walls can be sloped. The reflective walls form a reflecting cavity with the reflective substrate 202 and the light extraction element 230. The same material or materials used for the reflective substrate 202 can also be used for the reflective walls.

In some embodiments, the illumination assembly may include two or more light extraction elements for providing more uniform light. For example, FIG. 3 illustrates one embodiment of an illumination assembly 300 that includes two light extraction elements 330 and 360. The assembly 300 includes a reflective substrate 302, and a light source unit 310 positioned proximate the reflective substrate 302. The assembly 300 also includes a first light extraction element 330 positioned such that the light source unit 310 is between the first light extraction element 330 and the reflective substrate 302, and a second light extraction element 360 positioned such that the first light extraction element 330 is between the second light extraction element 360 and the light source unit 310. The assembly 300 also includes an optional diffuser layer 320 positioned such that the first and second light extraction elements 330, 360 are between the diffuser layer 320 and the light source unit 310. All of the design considerations and possibilities for the reflective substrate 202, the optional diffuser layer 220, and the light source unit 210 of the embodiment illustrated in FIG. 2 apply equally to the reflective substrate 302, the optional diffuser layer 320, and the light source unit 310 of the embodiment illustrated in FIG. 3. Further, the first and second light extraction elements 330 and 360 may include any suitable light extraction element described herein, e.g., light extraction element 230 of FIG. 2.

The first light extraction element 330 includes a first major surface 332 and a second major surface 334. Either or both of the first and second major surfaces 332, 334 may include a light extraction surface. For example, the first major surface 332 of light extraction element 330 may include a light extraction surface such that illumination light from the light source unit 310 is incident upon the light extraction surface 332.

Similarly, the second light extraction element 360 includes a first major surface 362 and a second major surface 364. Either or both of the first and second major surfaces 362, 364 may include a light extraction surface.

In one exemplary embodiment, the first light extraction element 330 can include a first light extraction surface that includes structures similar to those of prismatic brightness films, e.g., those structures found in BEF (available from 3M). Additionally, the second light extraction element 360 can include a light extraction surface having similar structures as those of the first light extraction surface. The first and second light extraction surfaces may be oriented in any suitable relationship to each other. For example, the prismatic brightness structures of the second light extraction surface may be positioned such that its grooves are substantially parallel to the grooves of the prismatic brightness structures of the first light extraction surface. Alternatively, the grooves of the second light extraction surface may be positioned such that they are substantially orthogonal to the grooves of the first light extraction surface.

The first light extraction element 330 may be positioned in any suitable relationship to the second light extraction element 360. For example, the first light extraction element 330 may be positioned apart from the second light extraction element 360. Alternatively, the first light extraction element 330 may be positioned such that it is in contact with the second light extraction element 360. In some embodiments, the first light extraction element 330 may be attached to the second light extraction element, e.g., as described in U.S. Patent Application No. 2004/0228106 (Stevenson et al.).

Figure 4A:
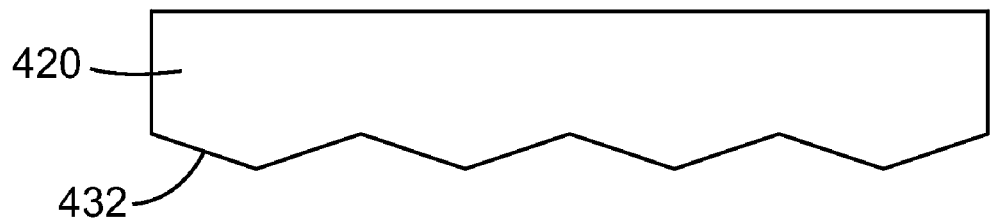
FIGS. 4A-C are schematic cross-sectional views of various embodiments of light extraction surfaces.
Figure 4B:
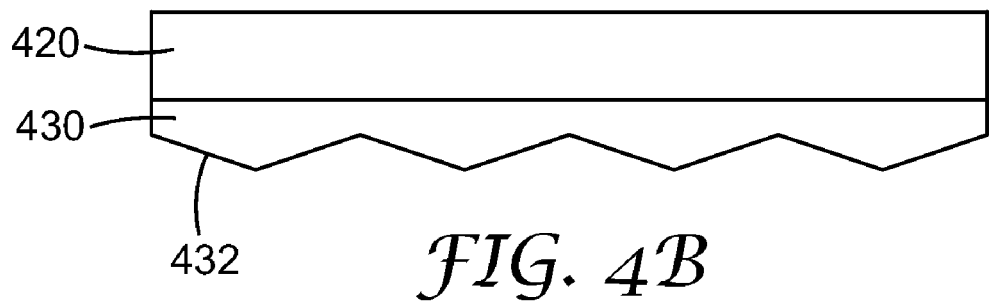
Figure 4C:
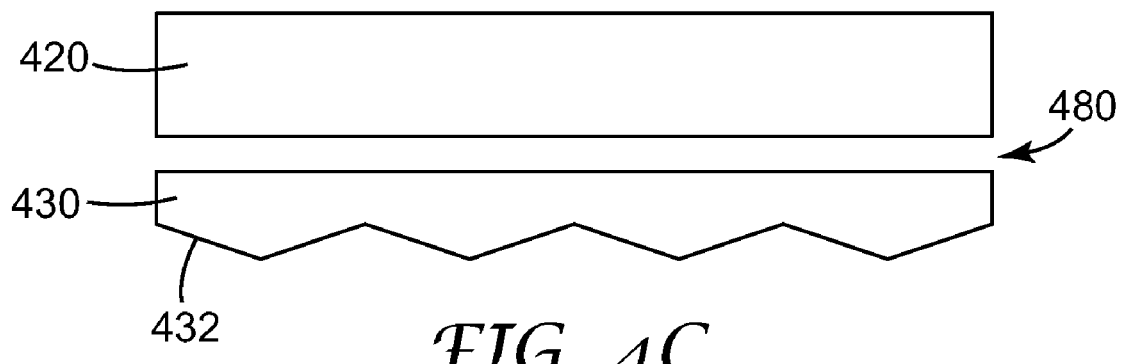

As mentioned herein, the light extraction elements of the present disclosure can include at least one light extraction surface. One exemplary embodiment of a light extraction surface 432 is schematically illustrated in FIG. 4A. In this embodiment, the light extraction surface 432 is the lower surface of a diffuser 420. In other embodiments, the light extraction surface 432 may be on an intermediate layer 430 between the light sources and the diffuser layer 420, for example, as shown in FIGS. 4B and 4C. The intermediate layer 430 may be attached to the diffuser layer 420, for example, using an adhesive such as a pressure sensitive adhesive (PSA), as shown in FIG. 4B, or there may be a gap 480 between the intermediate layer 430 and the diffuser layer 420, as shown in FIG. 4C. The gap 480 may be filled with air or some other layer.

Figure 5A:
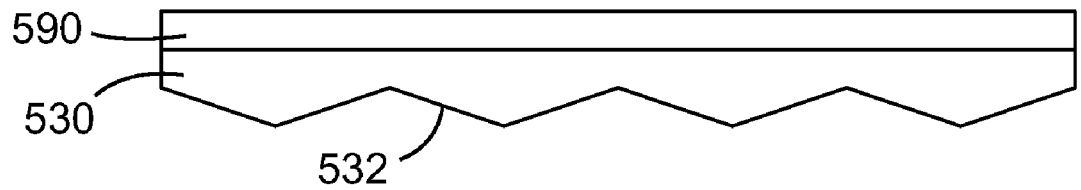
FIGS. 5A-C are schematic cross-sectional views of various embodiments of light extraction elements.
Figure 5B:
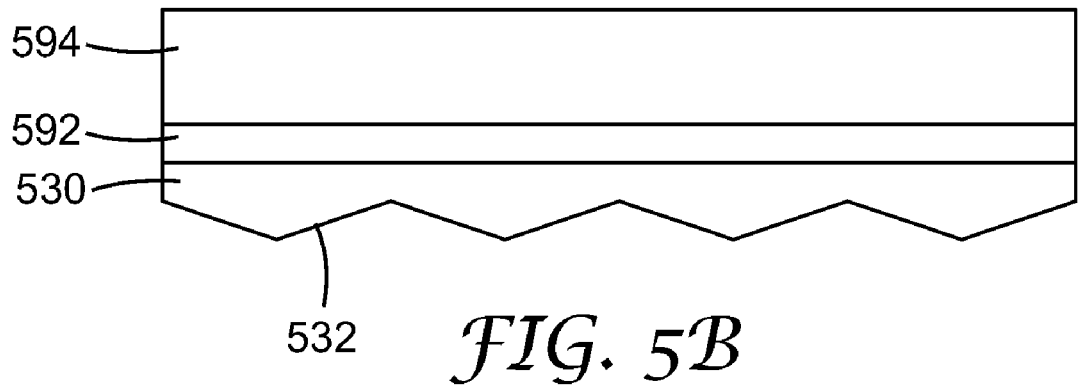
Figure 5C:
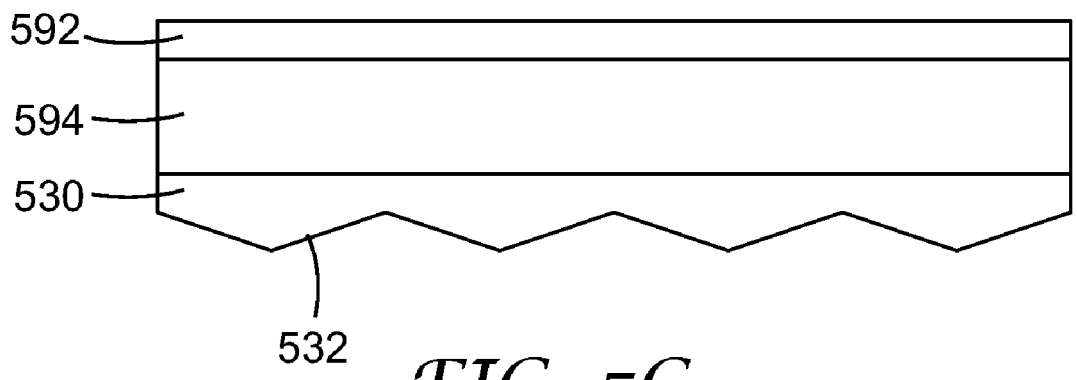

The light extraction elements of the present disclosure can take any suitable form or construction. For example, FIGS. 5A-C illustrate various constructions of light extraction elements. FIG. 5A illustrates a first light extraction element 530 that includes a light extraction surface 532. The light extraction element 530 is attached to a support layer 590. The support layer 590 may include any suitable material or materials such that the support layer 590 provides additional strength and/or stability to the light extraction element 530. Alternatively, support layer 590 can include one or more optical films, e.g., reflective polarizers, brightness enhancing films, and the like. Further, support layer 590 can include a second light extraction element as is further described herein.

FIG. 5B illustrates a light extraction element 530 that includes a light extraction surface 532, attached to an optical element 592 that is in turn attached to a transparent substrate or plate 594. Any suitable technique may be used to attach the optical element 592 to the light extraction element 530 and the transparent substrate 594, e.g., an optical adhesive. The transparent substrate 594 may include any suitable transparent material or materials that can provide support to the light extraction element 530 and the optical element 592, e.g., cyclo-olefin polymers and copolymers, MS (i.e., a random copolymer of 40 w % PS in 60 w % PMMA), polycarbonates, acrylates, PMMA, silicones, urethane acrylates, and copolymers and combinations thereof.

The optical element 592 can include any suitable optical film, e.g., reflective polarizers, brightness enhancing films, and the like. In some embodiments, the optical element 592 can include a second light extraction element as is further described herein.

Alternatively, FIG. 5C illustrates a light extraction element 530 having a light extraction surface 532 that is attached to a first surface of a transparent substrate 594, and the optical element 592 is attached to a second surface of the substrate 594.

Figure 8:
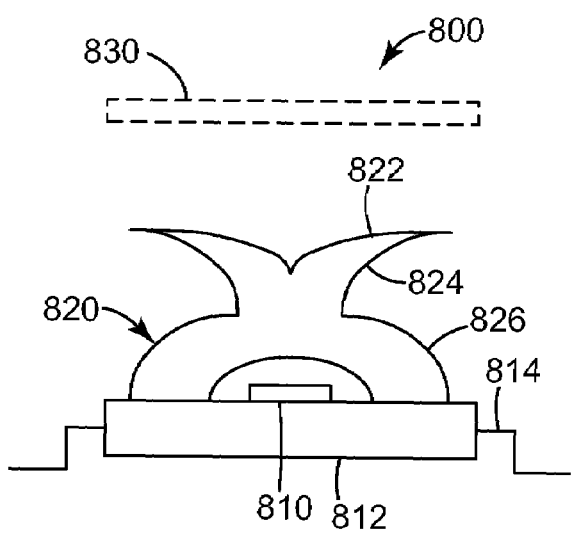
FIGS. 8-11 are schematic cross-sectional views of various packaged LEDs useable as light sources in the disclosed backlights.
Figure 9:
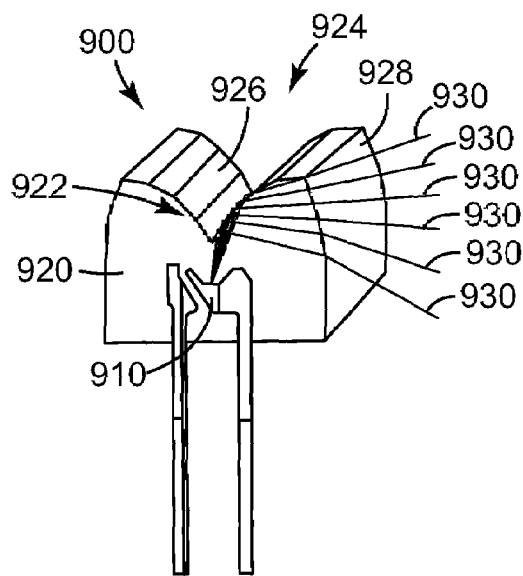
Figure 10:
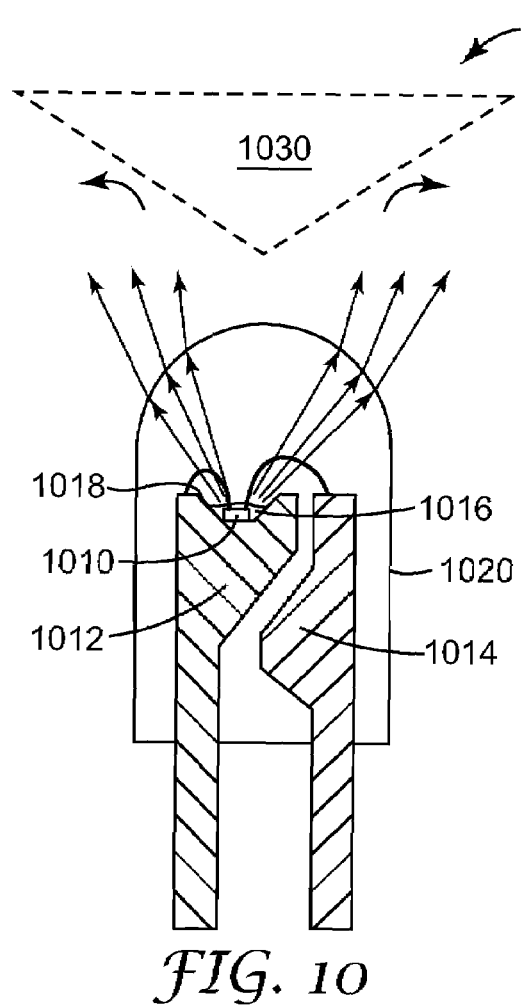
Figure 11:
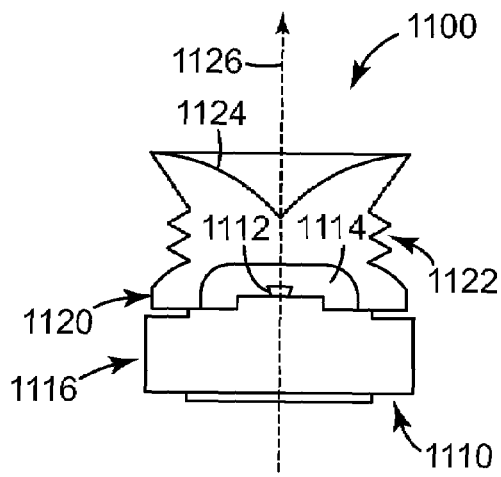

FIGS. 8-11 show views of some light sources that are useable in the disclosed backlights, but they are not intended to be limiting. The illustrated light sources comprise packaged LEDs. The light sources of FIGS. 8, 9, and 11 show side-emitting LED packages, where light from an LED die is reflected and/or refracted by an integral encapsulant or lens element to provide peak light emission in a generally lateral direction rather than forward along a symmetry axis of the source. The light source of FIG. 10 can be forward emitting or side-emitting, depending on whether an optional deflector is included.

In FIG. 8, a light source 800 includes an LED die 810 carried by a frame 812 and electrically connected to leads 814. Leads 814 are used to electrically and physically connect the light source 800 to a circuit board or the like. A lens 820 is attached to frame 812. The lens 820 is designed such that light emitted into an upper section of the lens is totally internally reflected on an upper surface 822 such that it is incident on a bottom surface 824 of the upper section and refracted out of the device. Light emitted into a lower section 826 of the lens is also refracted out of the device. Light source 800 can also include an optional diverter 830, such as a disk of reflective material, mounted above the lens 820 or attached to the upper surface 822. See also U.S. Patent Application Publication US 2004/0233665 (West et al.).

In FIG. 9, a light source 900 includes an LED die (not shown) mounted on a lead frame 910. A transparent encapsulant 920 encapsulates the LED die, lead frame 910, and a portion of the electrical leads. The encapsulant 920 exhibits reflection symmetry about a plane containing an LED die surface normal. The encapsulant has a depression 924 defined by curved surfaces 922. Depression 924 is essentially linear, centered on the plane of symmetry, and a reflective coating 926 is disposed on at least a portion of surface 922. Light emanating from the LED die reflects off reflective coating 926 to form reflected rays which are in turn refracted by a refracting surface 928 of the encapsulant, forming refracted rays 930. See also U.S. Pat. No. 6,674,096 (Sommers).

In FIG. 10, a light source 1000 includes an LED die 1010 disposed in a recessed reflector area 1018 of a lead frame 1012. Electrical power is supplied to the source by the lead frame 1012 and another lead frame 1014, by virtue of wire bond connections from the lead frames to the LED die 1010. The LED die has a layer of fluorescent material 1016 over it, and the entire assembly is embedded in a transparent encapsulation epoxy resin 1020 having a lensed front surface. When energized, the top surface of the LED die 1010 produces blue light. Some of this blue light passes through the layer of fluorescent material, and combines with yellow light emitted by the fluorescent material to provide a white light output. Alternately, the layer of fluorescent material can be omitted so that the light source emits only the blue light (or another color as desired) produced by the LED die 1010. In either case, the white or colored light is emitted in essentially a forward direction to produce peak light emission along a symmetry axis of the light source 1000. If desired, however, light source 1000 can optionally include a deflector 1030 having reflective surfaces to redirect light in generally sideways or lateral directions, thus converting the light source 1000 to be a side-emitter. Deflector 1030 may have mirror symmetry with respect to a plane perpendicular to the page, or may have rotational symmetry about a vertical axis coincident with a symmetry axis of the encapsulating resin 1020. See also U.S. Pat. No. 5,959,316 (Lowery).

In FIG. 11, a light source 1110 has an LED die 1112 supported by a package base 1116. A lens 1120 is coupled to base 1116, and a package axis 1114 passes through the center of base 1116 and lens 1120. The shape of lens 1120 defines a volume 1114 between LED die 1112 and lens 1120. The volume 1114 can be filled and sealed with silicone, or with another suitable agent such as a resin, air or gas, or vacuum. Lens 1120 includes a sawtooth refractive portion 1122 and a total internal reflection (TIR) funnel portion 186. The sawtooth portion is designed to refract and bend light so that the light exits from lens 1120 as close to 90 degrees to the package axis 1126 as possible. See also U.S. Pat. No. 6,598,998 (West et al.).

In addition to the diverters depicted in FIGS. 8 and 10, the sources can utilize other diverters, including the bifunctional diverters described in commonly assigned U.S. application Ser. No. 11/458,891, entitled "Direct-Lit Backlight Having Light Sources With Bifunctional Diverters."

Multicolored light sources, whether or not used to create white light, can take many forms in a backlight, with different effects on color and brightness uniformity of the backlight output area. In one approach, multiple LED dies (e.g., a red, a green, and a blue light emitting die) are all mounted in close proximity to each other on a lead frame or other substrate, and then encased together in a single encapsulant material to form a single package, which may also include a single lens component. Such a source can be controlled to emit any one of the individual colors, or all colors simultaneously. In another approach, individually packaged LEDs, with only one LED die and one emitted color per package, can be clustered together for a given recycling cavity, the cluster containing a combination of packaged LEDs emitting different colors such as blue/yellow or red/green/blue. In still another approach, such individually packaged multicolored LEDs can be positioned in one or more lines, arrays, or other patterns. For example, for the structures shown in FIGS. 7b-7e, the individually packaged LEDs can be arranged to follow the undulating ridges on the continuous pyramidal structures.

Other suitable LED light sources include LEDs packaged to emit an approximately Lambertian light pattern, available commercially from OSRAM, Lumileds Lighting, and other LED manufacturers. Such LEDs typically incorporate an encapsulant having a large hemispherical dome with an LED die at the center, or having a flat encapsulant surface with the LED die disposed below the surface.

EXAMPLES

The following examples were tested in a custom LED backlight test bed. The test bed was designed to simulate an LED-based area backlight for a 559 mm (22 inch) diagonal, 16:9 aspect-ratio, LCD television. The test bed had an open rectangular box frame forming the side walls of the backlight cavity, the long axis of the frame being placed horizontally. The inside walls of the box frame were lined with the EDR II film described above, which is a highly reflectivity diffuse white film.

The front side of the box frame was covered with a removable diffuser plate made from a diffuse white polymethyl methacrylate plate (available from Cyro Corp., Rockaway, N.J.) about 3 mm thick. This diffuser plate is similar to the diffuser plates currently used in CCFL and LED-based television backlights. The outer surface of the plate serves as the output surface for the test bed (i.e., the outer area of the backlight).

A backplane was attached to the back side of the box frame on four linear slides that allowed the backplane to be adjusted to different depths within the backlight cavity.

Four LED bars were affixed to the backplane on the side of the backplane facing the diffuser plate. The bars were arranged in two horizontal rows spanning the width of the backplane. Each bar had 5 red, 5 blue, and 10 green side-emitting Luxeon™ LEDs (available from Lumileds, San Jose, Calif.) arranged in a repeating green-red-blue-green pattern in a single line on a standard printed-circuit board. The center to center spacing between LEDs on a single bar was about 12 mm. The center to center spacing between adjacent horizontal rows was 152 mm.

On a single bar, the green, red, and blue LEDs were electrically connected in series by color so that the output of each color could be varied independently to allow for adjusting the color balance of the test bed. Two two-channel power supplies were connected to each bar. One power supply channel provided the drive current to the red LEDs, one channel provided current to the blue LEDs, and two channels provided current to the green LEDs with each channel driving 5 of the green LEDs. During a typical measurement, the red LEDs were driven at about 150 mA, the blue LEDs were driven at about 170 mA, and the green LEDs were driven at about 130 mA. Before the first measurements were taken, the LEDs were "burned-in" by running them at 350 mA for 166 hours, after which the output from the test bed was observed to be relatively stable over time.

A polycarbonate reflector support plate was attached to the backplane over the LED circuit boards. The reflector support plate was rectangular and slightly smaller than the inside of the test bed frame. The reflector support plate had holes to allow the LED lenses to extend through the plate. When mounted, the top surface of the reflector support plate was aligned with the bottom of the LED lenses. A high-reflectivity back reflector film (Vikuiti™ ESR film, available from 3M) was laminated to the reflector support plate. Thus mounted, the film layer was substantially flat and acted as the reflective substrate of the optical cavity of the backlight.

A clear 2 mm thick polymethyl methacrylate film support plate was mounted over the reflector support plate between the reflector support plate and the diffuser plate. The gap between the LEDs and the support plate was set by the height of standoffs used for mounting the support plate. The standoffs were set to about 6.4 mm and about 12.7 mm. A test film was attached to the film support plate. The test film was mounted on the side of the plate facing LEDs.

The performance of the test bed was measured using a calorimetric camera (model PM 1611, available from Radiant Imaging, Inc., Duvall, Wash.). The camera was fitted with a 105 mm lens and an ND2 neutral density filter. The software supplied by Radiant Imaging was used to calibrate the camera and take the measurements. Color and luminance calibration was done with the aid of a spot radiometer (model PR650, available from Photo Research, Inc., Chatsworth, Calif.). The test bed was placed in the vertical orientation, 4 m in front of the camera. The test bed was aligned to the camera such that the axis of the camera lens was substantially normal to the diffuser plate and aimed approximately at the center of the test bed.

Backlight constructions were measured by mounting the appropriate films (back reflector and test light extraction film) in the test bed and setting the backplane at the appropriate position to achieve the desired cavity thickness (defined as the space between the top of the back reflector plate and the bottom of the diffuser plate). Cavity thicknesses that were used include 18, 28, 38, and 48 mm. The film support plate was mounted above the reflector support plate with a gap of either 6.4 mm or 12.7 mm between them. The support plate was not mounted in the test bed for the measurements made without any test film.

The LEDs were turned on and warmed up for at least 90 minutes prior to recording any measurements. Measurements were carried out by configuring the test bed with the light extraction elements or films to be tested and then using the calorimetric camera to take pictures of the test bed with the backplane set at various depths. The results were inspected visually and analyzed for properties such as total luminance, luminance uniformity, and color uniformity across the surface of the diffuser plate.

Control

A comparative backlight cavity was configured having no light extraction elements or films over the LEDs. The cavity depth was 28 mm from the top of the back reflector (i.e., reflective substrate) to the bottom of the diffuser plate.

The appearance of the output area, i.e. the top of the diffuser plate, was highly non-uniform. An image or blur corresponding to each LED and their respective colors was clearly visible at the output area.

Example A

The backlight cavity included a BEF III film, available from 3M Company, that was used as a light extraction element. The film was supported on an acrylic plate with the prisms facing the LEDs and oriented horizontally (i.e., parallel to the direction of the LED rows). The cavity depth was 28 mm from the top of the reflective substrate to the bottom of the diffuser plate, and the partial reflector was placed approximately 12.7 mm above the reflective substrate. The reflective substrate was flame embossed ESR made using the techniques described in U.S. Pat. No. 6,096,247 (Ulsh et al.).

In appearance, this example demonstrated an improvement over the control with respect to brightness and color uniformity.

Example B

The backlight cavity included a cube corner light extraction film that was used as a light extraction element. This film was a single layer of 10 mil thick polycarbonate sheeting, the sheeting being flat and smooth on one major surface and having a pattern of prisms formed on the opposed major surface. The prisms are the same as the pyramidal cube corner array used in 3M™ Scotchlite™ Reflective Material 6260 High Gloss Film available from 3M Company, which pyramidal array is characterized by canted cube corner prisms whose height (from triangular base to cube corner peak) is about 3.5 mils (about 87.5 μm), and whose base triangles have included angles of about 55, 55, and 70 degrees. This extraction film was oriented such that the structured side of the film faced the LEDs. The film was supported on an acrylic plate. The cavity depth was 28 mm from the top of the reflective substrate to the bottom of the diffuser plate, and the light extraction film was placed approximately 12.7 mm above the reflective substrate. The reflective substrate was ESR.

In appearance, this example demonstrated an improvement over the control with respect to brightness and color uniformity.

Example C

The backlight cavity included two light extraction films that were utilized as light extraction elements. Each light extraction film was the same as the light extraction film used in Example B. The first film was supported on an acrylic plate with the cube corner elements facing the LEDs. The second film was supported on the opposite side of the acrylic plate with the cube corner elements facing the LEDs (touching the acrylic plate). The cavity was approximately 18 mm deep, and the light extraction films were placed approximately 12.7 mm above the reflective substrate. The reflective substrate was ESR.

In appearance, this example demonstrated an improvement over the control with respect to brightness and color uniformity.

Example D

The backlight cavity included two light extraction films that were utilized as light extraction elements. Each light extraction film was the same as the light extraction film used in Example B. The first film was supported on an acrylic plate with the cube-corner elements facing the LEDs. The opposite side of the acrylic plate included a diffuse film. The second film was affixed to the side of the acrylic plate having the diffuse film with the cube corner elements facing the LEDs (touching the diffuse film). The cavity was approximately 28 mm deep, and the light extraction film construction was placed approximately 12.7 mm above the reflective substrate. The reflective substrate was ESR.

In appearance, this example demonstrated an improvement over the control with respect to brightness and color uniformity.

Example E

The backlight cavity included a light extraction film that is described in regard to FIGS. 7b-e of the present disclosure as the light extraction element, except that the film consisted of a 5 mil thick base film of polyethylene terephthalate (PET) on which a layer of cured resin was formed, the resin having a refractive index of about 1.586 and having the prismatic structured surface 722 formed therein. The light extraction film had a nominal overall thickness of about 6 mils. Each prism 726 on the structured surface had a characteristic length λ (see FIG. 7e) of approximately 150 μm, a maximum and minimum width Wmax, Wmin of approximately 68 μm and 4 μm respectively, and a maximum and minimum height Hmax, Hmin of about 25 μm and 1 μm respectively. The inclined prism surfaces of each prism were substantially flat in transverse cross-section (see the y-z plane of FIG. 7d) and formed an apex angle therebetween of approximately 96 degrees. The prisms had a structural asymmetry as depicted in FIGS. 7b-e, where the cant angle θ was approximately 19 degrees. The film was supported on an acrylic plate with the prisms facing the LEDs and the prisms oriented horizontally (i.e., each prism extending parallel to the direction of the LED rows). The cavity depth was 38 mm from the top of the reflective substrate to the bottom of the diffuser plate, and the light extraction element was placed approximately 12.7 mm above the reflective substrate. The reflective substrate was ESR.

In appearance, this example demonstrated an improvement over the control with respect to brightness and color uniformity.

Example F

The backlight cavity included the light extraction film of Example E as the light extraction element. The film was supported on an acrylic plate with the prisms facing the LEDs and oriented horizontally (i.e., each prism extending parallel to the direction of the LED rows). The cavity depth was 28 mm from the top of the reflective substrate to the bottom of the diffuser plate, and the light extraction construction was placed approximately 12.7 mm above the reflective substrate. The reflective substrate was ESR.

In appearance, this example demonstrated an improvement over the control with respect to brightness and color uniformity.

Results

A comparison of Examples A-F is shown in Table 1. A Relative Efficiency parameter was calculated for each backlight construction by dividing the average brightness of the example by the average brightness of the control, where average brightness in each case was calculated for substantially the entire output area of the respective backlights. A Brightness Non-Uniformity parameter was calculated for each backlight construction by dividing the standard deviation of brightness by the average brightness over substantially the entire output area of the backlight. A Color Non-Uniformity parameter (Δuv) was calculated for each backlight construction as the average value of the point-wise deviation of the color from the average color of the example, where color is expressed in CIE u'v' color space. Thus, $$\Delta uv = \frac{1}{N}\sqrt{\sum_N ((u' - u'_{avg})^2 + (v' - v'_{avg})^2)},$$

where N is the number of pixels in the image of the test system, u' and v' are the color coordinates for each pixel, and u'$_{avg}$ and v'$_{avg}$ are the average color coordinates. This color non-uniformity was measured not over the entire output area, but over a rectangular portion of the output area 475 mm long and 75 mm wide, centered over the upper LED bar or row of the backlight prototype.

TABLE 1

Relative Efficiency, Brightness Non-Uniformity, Color Non-Uniformity

| Example | Relative Efficiency | Brightness Non-Uniformity | Color Non-uniformity |
|---|---|---|---|
| Control. | 100% | 13% | 0.0078 |
| A | 77% | 8% | 0.0073 |
| B | 91% | 10% | 0.0070 |
| C | 80% | 10% | 0.0060 |
| D | 76% | 10% | 0.0060 |
| E | 93% | 8% | 0.0043 |
| F | 93% | 10% | 0.0053 |

One can see from the table that Examples E and F, which utilize the light extraction film described in connection with FIGS. 7b-e above, exhibit an optimum balance of high efficiency, low brightness non-uniformity, and low color non-uniformity compared to the other examples. Upon further study it can also be seen that the light extraction film used in Examples E-F has a structured surface topography that distinguishes it from many other light extraction films.

Figure 15:
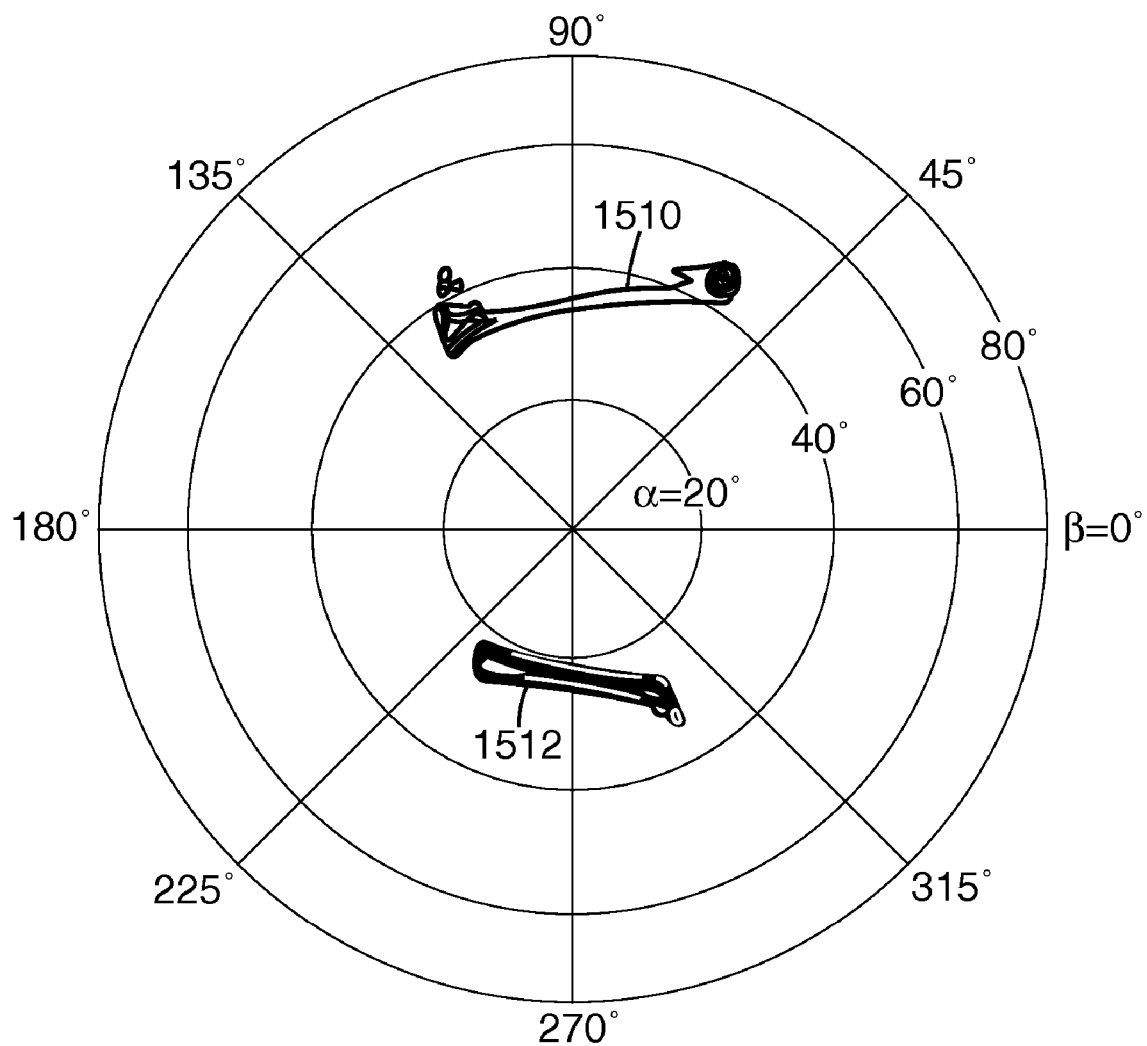
FIG. 15 is a polar intensity plot of the light extraction film of Examples E and F.

Each of the light extraction films A-F were observed using a ConoScope instrument available from autronic-MELCHERS GmbH, Karlsruhe, Germany. The result is shown in the polar intensity plot of FIG. 15. The setup was essentially that of FIG. 13c, except that the ConoScope instrument was used to measure the deflected light. FIG. 15 plots the measured luminance or brightness as a function of polar angle α and azimuthal angle β. The deflected beams 1510, 1512 are seen to be deflected at polar angles ranging from about 20 to about 40 degrees, and each having an azimuthal width Δβ of greater than 45 degrees but less than 90 degrees. In FIG. 15, the lowest luminance plotted is 250 cd/m², and the peak luminance is 2078 cd/m² (occurring in beam 1510), hence the shapes of beams 1510, 1512 are defined at about 10% of peak luminance or brightness.

As can be inferred from FIG. 15, the light extraction film of Examples E and F exhibits an azimuthal beam widening of about 120° or more. Further, as shown in FIG. 15, the light extraction film of Examples E and F redirects well under 10% of the transmitted light to polar angles less than 20°, and redirects well over 90% of the transmitted light to polar angles greater than 20°.

All references and publications cited herein are expressly incorporated herein by reference in their entirety into this disclosure, except to the extent they may directly contradict this disclosure. Illustrative embodiments of this disclosure are discussed and reference has been made to possible variations within the scope of this disclosure. These and other variations and modifications in the disclosure will be apparent to those skilled in the art without departing from the scope of the disclosure, and it should be understood that this disclosure is not limited to the illustrative embodiments set forth herein. Accordingly, the disclosure is to be limited only by the claims provided below.

What is claimed is:

1. An illumination assembly, comprising:
   a reflective substrate;
   a first light extraction surface comprising an azimuthal beam widening topography, wherein the first light extraction surface comprises an array of elongate continuous prisms occupying an x-y plane thereof, wherein each prism in the array comprises two inclined surfaces that meet to form a ridge, and wherein the ridges are substantially continuous and non-linear; and
   a light source unit comprising one or more light sources capable of producing illumination light, wherein the light source unit is between the first light extraction surface and the reflective substrate, and wherein the first light extraction surface faces the light source unit.

2. The assembly of claim 1, wherein the ridges undulate in the x-y plane.

3. The assembly of claim 1, wherein the inclined surfaces of the prisms are curved in a plane normal to the x-y plane.

4. The assembly of claim 1, wherein the inclined surfaces of the prisms are curved in a y-z plane normal to the x-y plane.

5. An illumination assembly, comprising:
   a reflective substrate;
   a first light extraction surface comprising an array of closely packed conical structures, wherein the array comprises substantially no flat land areas between the conical structures wherein a base of the conical structures lies in an x-y plane of the surface and an apex of the conical structures lies outside the x-y plane of the surface; and
   a light source unit comprising one or more light sources capable of producing illumination light, wherein the light source unit is between the first light extraction surface and the reflective substrate, and wherein the apexes of the conical structures in the array on the first light extraction surface are directed toward the light source unit.

6. The assembly of claim 5, wherein the bases of the conical structures in the array are adjacent to one another.

7. The assembly of claim 6, wherein the conical structures have a cross-sectional shape selected from circular and elliptical in a plane parallel to the x-y plane.

8. The assembly of claim 5, wherein the base of the conical structures is selected from circular, elliptical and hexagonal.

9. The assembly of claim 5, wherein the apexes of the conical structures lie outside a plane normal to the x-y plane.

10. An illumination assembly, comprising:
    a reflective substrate;
    a first light extraction surface comprising at least one faceted surface, wherein the faceted surface has an in-plane curvature in the x-y plane; and a light source unit comprising one or more light sources capable of producing illumination light, wherein the light source unit is between the first light extraction surface and the reflective substrate, and wherein the first light extraction surface faces the light source unit.

11. The assembly of claim 10, wherein the at least one faceted surface lies on individual light diverting elements on the light extraction surface.

12. The assembly of claim 10, wherein the light extraction surface comprises a plurality of faceted surfaces, and wherein the faceted surfaces are distributed among a plurality of light diverting elements on the light extraction surface.

13. The assembly of claim 10, wherein the curvature is sufficient to produce a difference of azimuthal angle $\Delta\beta$ of at least 15° with respect to a beam normally incident on the light extraction surface.

14. An illumination assembly, comprising:
a reflective substrate;
a first light extraction surface comprising means for producing a difference of azimuthal angle $\Delta\beta$ of at least 15° with respect to a beam normally incident on the light extraction surface; and
a light source unit comprising one or more light sources capable of producing illumination light, wherein the light source unit is between the first light extraction surface and the reflective substrate, and wherein the first light extraction surface faces the light source unit.

15. The assembly of claim 14, wherein the means for producing a difference of azimuthal angle comprises a plurality of non-curved facets arranged at varying angles in a x-y plane of the light extraction surface.

16. The assembly of claim 14, wherein the means for producing a difference of azimuthal angle comprises at least one light diverting element having at least one facet with a curvature in the x-y plane.

17. The assembly of claim 16, wherein the facets lie on multiple light diverting elements.

18. A directly illuminated display system, comprising:
a display panel comprising an illumination side; and
an illumination assembly disposed to the illumination side of the display panel, the illumination assembly comprising:
a reflective substrate;
a first light extraction surface comprising an azimuthal beam widening topography wherein the first light extraction surface comprises an array of elongate continuous prisms occupying an x-y plane thereof, wherein each prism in the array comprises two inclined surfaces that meet to form a ridge, and wherein the ridges are substantially continuous and undulate in the x-y plane, wherein the ridges lie outside an x-z plane normal to the x-y plane, and further wherein the width of the prisms undulates along the y-direction and the height of the prisms undulates along a z-direction normal to the x-y plane; and
a light source unit comprising one or more light sources capable of producing illumination light, wherein the light source unit is between the first light extraction surface and the reflective substrate, and wherein the first light extraction surface faces the light source unit.

19. The system of claim 18, wherein the light source unit comprises an array of LEDs comprising rows of LEDs oriented substantially along the ridges of the prisms on the first light extraction surface.

20. The system of claim 18, wherein the LEDs comprise side fired LEDs.

21. The system of claim 18, wherein the inclined surfaces of the prisms are curved in a plane normal to the x-y plane.

22. The system of claim 18, wherein the inclined surfaces of the prisms are curved in a y-z plane normal to the x-y plane.

23. The system of claim 18, further comprising a diffuser layer positioned such that the first light extraction surface is between the diffuser layer and the light source unit.

24. The system of claim 23, further comprising a reflective polarizer between the diffuser layer and the first light extraction surface.

25. The system of claim 18, further comprising a reflective polarizer, wherein the first light extraction surface is between the reflective polarizer and the light source unit.

26. The system of claim 18, wherein the light source unit comprises a first light source capable of generating red light, a second light source capable of generating green light, and a third light source capable of generating blue light.

* * * * *

UNITED STATES PATENT AND TRADEMARK OFFICE
CERTIFICATE OF CORRECTION

PATENT NO.          : 7,695,180 B2
APPLICATION NO.     : 11/467230
DATED               : April 13, 2010
INVENTOR(S)         : Craig Russell Schardt It is certified that error appears in the above-identified patent and that said Letters Patent is hereby corrected as shown below:

Page 3,
Column 1 (Other Publications), Line 2, Delete "Apppl." and insert -- Appl. --, therefor.

Column 1,
Line 23, Delete "TRANSFLECTOR." and insert -- TRANSFLECTOR (Attorney Docket No. 61199US006). --, therefor.

Column 6,
Line 35, Delete "Nos." and insert -- No. --, therefor.

Column 9,
Line 16, Delete "Pokomy" and insert -- Pokorny --, therefor.

Column 10,
Line 43, Delete "11/018,608; 11/018,605; 11/018,961; and 10/858,539." and insert
-- 11/018,608 (Attorney Docket No. 60116US002); 11/018,605 (Attorney Docket No. 60159US002); 11/018,961 (Attorney Docket No. 60390US002); and 10/858,539 (Attorney Docket No. 59334US002). --, therefor.

Column 12,
Line 62, Delete "Appeldom" and insert -- Appeldorn --, therefor.

Column 17,
Line 60, Delete "60°,120°," and insert -- 60°, 120°, --, therefor.

Column 18,
Line 10, Delete "250°" and insert -- 25° --, therefor.

Signed and Sealed this
Thirty-first Day of May, 2011

David J. Kappos
*Director of the United States Patent and Trademark Office*

Column 26,
Line 35, Delete "calorimetric" and insert -- colorimetric --, therefor.

Line 63, Delete "calorimetric" and insert -- colorimetric --, therefor.